US007822158B2

(12) United States Patent
Ishii et al.

(10) Patent No.: US 7,822,158 B2
(45) Date of Patent: Oct. 26, 2010

(54) CLOCK DATA RECOVERY CIRCUIT CAPABLE OF GENERATING CLOCK SIGNAL SYNCHRONIZED WITH DATA SIGNAL

(75) Inventors: Masashi Ishii, Tokyo (JP); Takanori Hirota, Tokyo (JP); Atsuhiko Ishibashi, Tokyo (JP); Yasushi Hayakawa, Tokyo (JP); Takeshi Oshita, Tokyo (JP); Yoshiyuki Ota, Tokyo (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 1153 days.

(21) Appl. No.: 11/477,597

(22) Filed: Jun. 30, 2006

(65) Prior Publication Data

US 2007/0018704 A1 Jan. 25, 2007

(30) Foreign Application Priority Data

Jul. 5, 2005 (JP) .............................. 2005-196489

(51) Int. Cl.
*H04L 7/00* (2006.01)
(52) U.S. Cl. ........................ 375/354; 370/503; 327/141; 327/165
(58) Field of Classification Search ................. 375/354; 370/503; 327/141, 165
See application file for complete search history.

(56) References Cited

U.S. PATENT DOCUMENTS 4,358,741 A * 11/1982 Nardin ........................... 331/2
6,316,966 B1 * 11/2001 Chang et al. ................... 327/2
6,331,792 B1 * 12/2001 Tonietto ........................ 327/48
6,377,082 B1 * 4/2002 Loinaz et al. ................. 327/20
6,564,359 B2 * 5/2003 Saeki ........................... 716/5
6,807,225 B1 * 10/2004 Tonietto et al. .............. 375/219
7,099,424 B1 * 8/2006 Chang et al. ................. 375/370
7,127,022 B1 * 10/2006 Dieguez ...................... 375/375
7,515,656 B2 * 4/2009 Yamaguchi et al. ......... 375/326
7,573,932 B2 * 8/2009 Kim et al. .................... 375/130
2003/0200518 A1 * 10/2003 Saeki ........................... 716/6

OTHER PUBLICATIONS

Tatsuya Saito et al., A 50-mW/ch 2.5-Gb/s/ch Data Recovery Circuit for the SFI-5 Interface Using Novel Eye-tracking Method, 2003 Symposium on VLSI Circuits Digest of Technical Papers, pp. 57-60.

* cited by examiner

*Primary Examiner*—Juan A Torres
(74) *Attorney, Agent, or Firm*—Buchanan Ingersoll & Rooney PC

(57) ABSTRACT

A phase comparison circuit detects a phase difference between a data signal and the output from a variable delay circuit. A Code Operator detects a value of a control code corresponding to a delay equal to one period of an output clock. Then, when a delay amount of the variable delay circuit exceeds one period of a clock during synchronization of the output clock with the data signal while the control code is changed in accordance with the detection result by the phase delay circuit, a control code corresponding to a delay equal to one period of the output clock is added or subtracted to/from the control code at a time. Therefore, even if there is a difference in frequency between a data signal and a clock, it becomes possible to synchronize the data signal and the clock with application of the same clock phase.

11 Claims, 20 Drawing Sheets

IN CASE OF FIRST EMBODIMENT

IN CASE OF FIFTH EMBODIMENT

FIG. 18

CLOCK DATA RECOVERY CIRCUIT CAPABLE OF GENERATING CLOCK SIGNAL SYNCHRONIZED WITH DATA SIGNAL

BACKGROUND OF THE INVENTION

1. Field of the Invention

The present invention relates to a technique of generating a clock signal synchronized with a transition of a received data signal, and more particularly to a clock data recovery (also called CDR hereinafter) circuit capable of generating a clock signal synchronized with a data signal even when the frequency of a clock (Recovered CLOCK) signal synchronized with the data signal is different from the frequency of a clock (CLOCK) signal used in a semiconductor integrated circuit.

2. Description of the Background Art

In recent years, an interface circuit for transmission of serial data, such as PCI (Peripheral Component Interconnection)-Express or Serial-ATA (AT Attachment) is used in communication equipment and computers. A conventional technique using a CDR circuit as such an interface circuit includes "A 50-mW/ch 2.5-Gb/s/ch Data Recovery Circuit for the SFI-5 Interface Using Novel Eye-tracking Method", 2003 Symposium on VLSI Circuits Digest of Technical Papers, pp. 57-60.

This document discloses a CDR circuit formed of a data edge detector, an up/down decision circuit, a one-period clock phase pointer, an eight-phase clock divider, a selector selecting one from eight phase clocks, and the like and using internal clocks having phase differences of 0° and 90°.

In the prior art as described above, in order to generate precise eight phase clocks by the eight-phase clock divider, the two phase internals clock input to the CDR circuit are required to have precise phase differences of 0° and 90°. Therefore, there need to be provided outside the CDR circuit a circuit generating two phase internal clocks and a clock distribution circuit performing phase control between two phases, thereby complicating the circuit configuration.

In addition, in order to precisely synchronize the clock signal with the transition of the data signal, the division number of one period needs to be made larger than eight, which increases the number of eight-phase clock dividers. Since an eight-phase clock divider is an analog circuit having a through current path, the current consumption in the CDR circuit is increased.

Furthermore, since the selector receives an output from the one-period clock phase pointer to select one from eight phase input clocks, a narrow-width pulse signal such as glitch noise or hazard may sometimes be output in switching of a propagation path, resulting in a malfunction of the system.

SUMMARY OF TH INVENTION

An object of the present invention is to provide a CDR circuit capable of synchronization between a data signal and a clock without requiring a two phase internal clocks even when there is a difference between the data signal and the clock in frequency.

Another object of the present invention is to provide a CDR circuit that does not require an eight-phase clock divider having a through current path.

In accordance with an aspect of the present invention, a clock data recovery circuit generates an output clock synchronized with a data signal. The clock data recovery circuit includes: a first detection portion detecting a phase difference between the data signal and the output clock; a variable delay portion varying a delay of a clock in accordance with a control code; and a code changing portion changing a value of the control code. The code changing portion includes a second detection portion detecting a value of a control code corresponding to a delay equal to one period of the output clock, a storage portion storing the value of the control code detected by the second detection portion, and an operation portion adding or subtracting at a time the value stored in the storage portion to/from a control code when a delay amount of the variable delay portion exceeds one period of a clock in synchronizing the output clock with the data signal while changing the control code in accordance with a detection result by the first detection portion.

Therefore, it becomes possible to synchronize a data signal and a clock while applying the same clock phase even if there is a difference between the data signal and the clock in frequency.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 18 shows the relation between the numerical values of control codes and control signals TAP<0:15> and PI 100%/50%.

DESCRIPTION OF THE PREFERRED EMBODIMENTS

Figure 1:
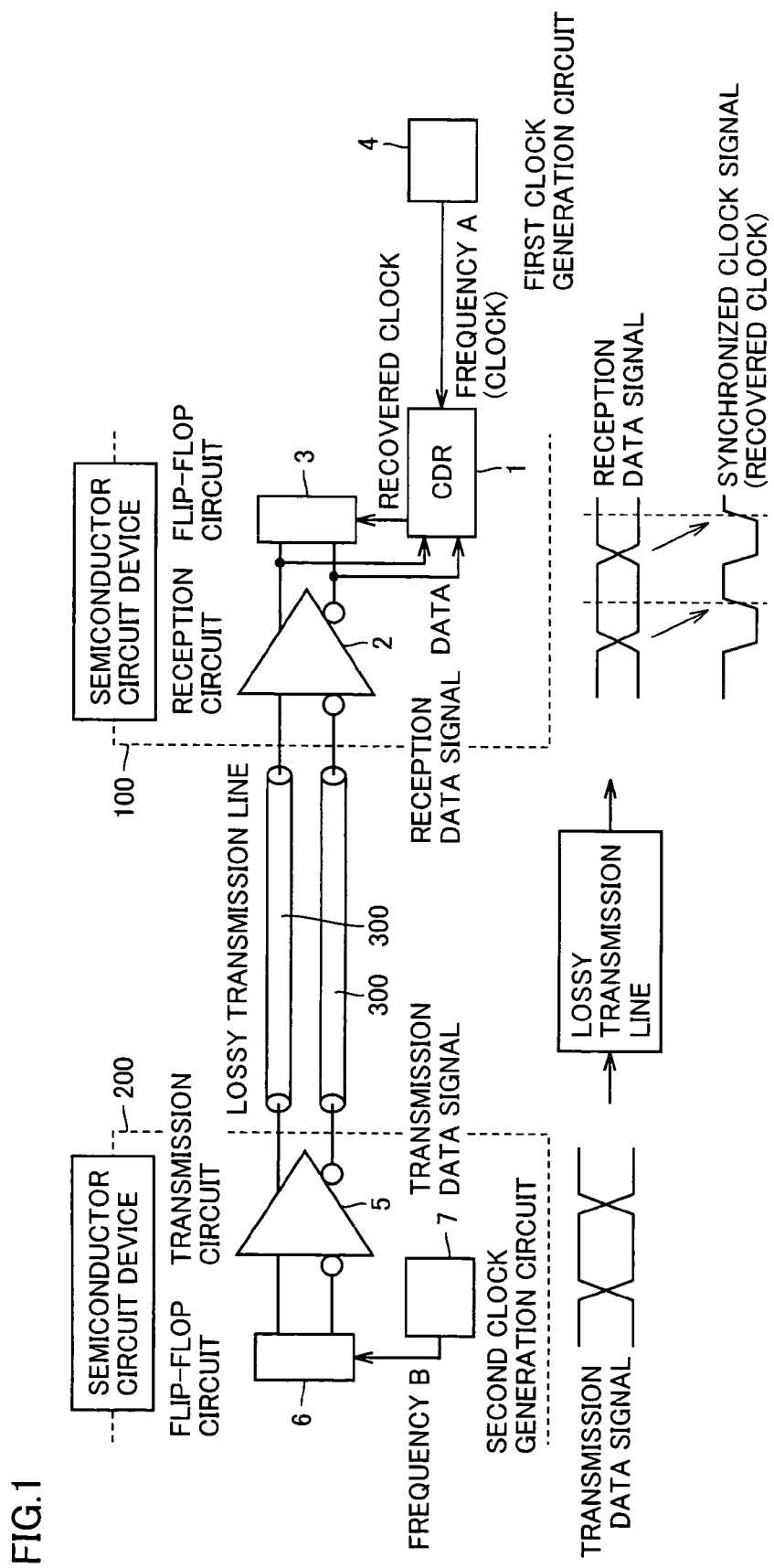
FIG. 1 is a diagram showing an exemplary system adopting a CDR circuit in an embodiment of the present invention.

FIG. 1 is a diagram showing an exemplary system adopting a CDR circuit in an embodiment of the present invention. In this system, a semiconductor circuit device 100 receives data from a semiconductor circuit device 200 through a lossy transmission line 300. Semiconductor circuit device 100 includes a CDR circuit 1, a reception circuit 2 receiving a reception data signal through lossy transmission line 300, a flip-flop circuit 3 outputting data in synchronization with a Recovered CLOCK signal from CDR circuit 1, and a first clock generation circuit 4 generating a CLOCK signal having a frequency A applied to CDR circuit 1.

On the other hand, semiconductor circuit device 200 includes a transmission circuit 5 sending a transmission data signal through lossy transmission line 300, a flip-flop circuit 6 outputting data to transmission circuit 5 in synchronization with CLOCK signal, and a second clock generation circuit 7 generating a CLOCK signal having a frequency B applied to flip-flop circuit 6.

In this system, the frequency A of CLOCK signal used in semiconductor circuit device 100 differs from the frequency B of CLOCK signal used in semiconductor circuit device 200, so that CDR circuit 1 needs to generate Recovered CLOCK signal synchronized with the data signal based on CLOCK signal having frequency A and apply the same to flip-flop circuit 3.

First Embodiment

Figure 2:
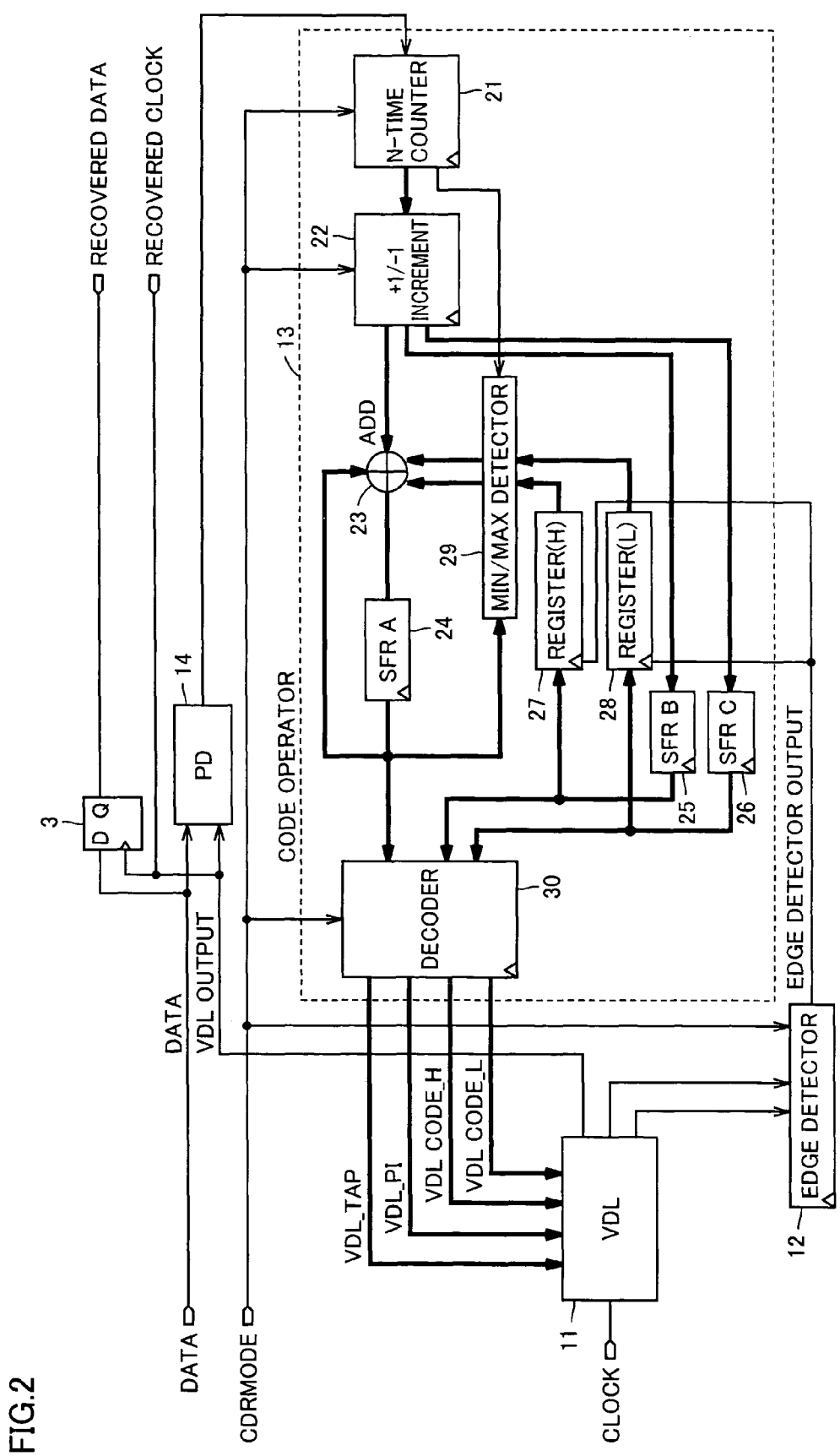
FIG. 2 is a block diagram showing an internal configuration of a CDR circuit in a first embodiment of the present invention.

FIG. 2 is a block diagram showing an internal configuration of a CDR circuit in a first embodiment of the present invention. This CDR circuit includes a variable delay circuit (VDL) 11 capable of varying a delay amount according to a control code, a circuit (Edge Detector) 12 detecting one period of CLOCK, a circuit (CODE Operator) 13 deciding a control code applied to VDL 11, and a phase comparison circuit (PD) 14 making a phase comparison between data and clock to output a signal for correction.

Furthermore, CODE Operator 13 includes a counter circuit (N-time Counter) 21 receiving a signal output from PD 14 to determine an average lead (lag) of a clock, a +1/−1 Increment circuit 22 receiving an output signal from N-time Counter 21 to decide a control code for addition/subtraction, an adder (ADDER) 23 calculating a control code, a shift register (SFR A) 24 shifting an output signal from ADDER 23, shift registers (SFR B, SFR C) 25 and 26 shifting a control code from +1/−1 Increment circuit 22, a register (Register (H)) 27 for storing the upper limit value of a control code, a register (Register (L)) 28 for storing the lower limit value of a control code, an MIN/MAX Detector 29 detecting that a control code is the upper limit value of a control code stored in Register (H) 27 or the lower limit value of a control code stored in Register (L) 28, and a Decoder 30 decoding control codes output from SFR A24, SFR B25 and SFR C26.

CDRMODE is an input pin for switching an operational state of CDR circuit 1. CDR circuit 1 performs detection and storage of a control code corresponding to one period of CLOCK when CDRMODE is at High level (simply referred to as "H" hereinafter). CDR circuit 1 performs synchronization between DATA and CLOCK when CDRMODE is at Low level (simply referred to as "L" hereinafter).

DATA is an input pin receiving data from reception circuit 2. CLOCK is an input pin receiving a clock from first clock generation circuit 4. VDL output (Recovered CLOCK) from VDL 11 is connected to a clock terminal of flip-flop circuit 3. Flip-flop circuit 3 synchronizes data from reception circuit 2 with Recovered CLOCK and outputs the data to Recovered DATA serving as an output pin.

PD 14 makes a phase comparison between DATA and VDL output and outputs a signal for correcting a phase difference. N-time Counter 21 receives and counts signals output from PD 14 to determine whether VDL output leads or lags in phase on the average every N times. More specifically, if the phase of VDL output is lagging, N-time Counter 21 decrements the count value. If the phase of VDL output is leading, N-time Counter 21 increments the count value.

+1/−1 Increment circuit 22 outputs to ADDER 23 a signal incrementing a control code (VDL_TAP/VDL_PI) for controlling VDL 11 by 1 if the count value of N-time Counter 21 is larger than m (m<<N). On the other hand, +1/−1 Increment circuit 22 outputs to ADDER 23 a signal decrementing a control code for controlling VDL 11 by 1 if the count value of N-time Counter 21 is smaller than −m. It is noted that VDL_TAP and VLD_PI are control codes for controlling TAP Line and PI Line in VDL 11 as described later.

In addition, +1/−1 Increment circuit 22 increments VDL CODE_H and decrements VDL CODE_L to output the results to SFR B25 and SFR C26, respectively.

MIN/MAX Detector 29 receives the control code (VDL_TAP/VDL_PI) calculated by ADDER 23 through SFR A24 to output a detection signal to ADDER 23 when detecting that the control code is the upper limit value stored in Register (H) 27 or the lower limit value stored in Register (L) 28. It is noted that MIN/MAX Detector 29 makes a determination every time N-time counts are completed by N-time Counter 21.

ADDER 23 adds a control code output from SFR A24 to a control code output from +1/−1 Increment circuit 22 and in addition, upon reception of a detection signal from MIN/MAX Detector 29, performs an addition/subtraction of a code corresponding to one period of CLOCK to/from a control code.

When one period of CLOCK is detected by Edge Detector 12, Register (H) 27 and Register (L) 28 receive the respective Edge Detector outputs for storing the upper limit value of VDL CODE_H and the lower limit value of VDL CODE_L through SFR B25 and SFR C26.

Figure 3:
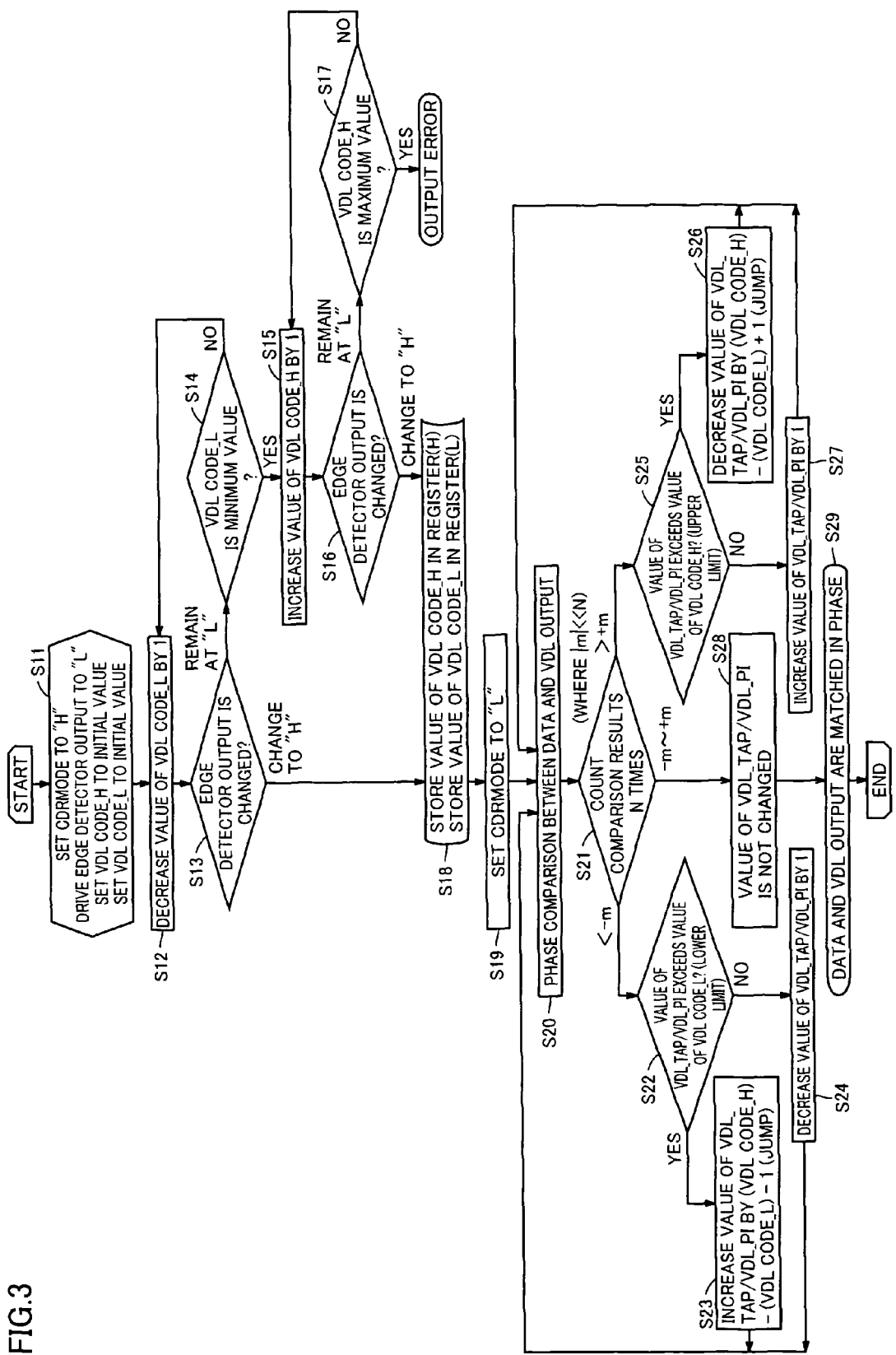
FIG. 3 is a flowchart illustrating a process procedure of a CDR circuit 1 in the first embodiment of the present invention.

FIG. 3 is a flowchart illustrating a process procedure of CDR circuit 1 in the first embodiment of the present invention. In this flowchart, steps S11-S18 are a process of performing detection and storage of a control code corresponding to one period of CLOCK (CDRMODE="H"), and steps S20-S29 are a process of performing synchronization between DATA and CLOCK (CDRMODE="L").

First, CDRMODE is set to "H" and the output of Edge Detector 12 is driven to "L". Then, VDL CODE_H and VDL CODE_L in +1/−1 Increment circuit 22 are set at initial values (S11).

Then, +1/−1 Increment circuit 22 decreases the value of VDL CODE_L by 1 (S12) and determines whether or not the output of Edge Detector 12 goes to "H" (S13). If the output of Edge Detector 12 remains at "L" (S13, remains at "L"), whether or not the value of VDL CODE_L is the minimum value is determined (S 14). If the value of VDL CODE_L is not the minimum value (S14, No), returning to step S12, the following process is repeated.

On the other hand, if the value of VDL CODE_L is the minimum value (S14, Yes), +1/−1 Increment circuit 22 increases the value of VDL CODE_H by 1 (S15) and determines whether or not the output of Edge Detector 12 goes to "H" (S16). If the output of Edge Detector 12 remains at "L" (S16, remain at "L"), whether or not the value of VDL CODE_H is the maximum value is determined (S17). If the value of VDL CODE_H is not the maximum value (S17, No), returning to step S15, the following process is repeated.

If the value of VDL CODE_H is the maximum value (S17, Yes), an error is output as a control code corresponding to one period of CLOCK has not been found. The process then ends.

If the output of Edge Detector 12 goes to "H" at step S13 or S16, a control code corresponding to one period of CLOCK has been found and therefore the value of VDL CODE_H and the value of VDL CODE_L at that point are stored in Register (H) 27 and Register (L) 28, respectively (S18).

Then, CDRMODE is set to "L" (S19), and PD14 makes a phase comparison between DATA and VDL output (S20). N-time Counter 21 counts the phase comparison results from PD 14 N times, and if the count value is smaller than −m (S21, <−m), MIN/MAX Detector 29 determines whether or not the value of VDL_TAP/VDL_PI calculated by ADDER 23 exceeds the value of VDL CODE_L stored in Register (L) 28 (S22).

If the value of VDL CODE_L is exceeded (S22, Yes), ADDER 23 performs a process (CODE JUMP) of increasing the value of VDL_TAP/VDL_PI by (VDL CODE_H)−(VDL CODE_L)−1 (S23). Returning to step S20, the following process is repeated.

On the other hand, if the value of VDL CODE_L is not exceeded (S22, No), the value of VDL_TAP/VDL_PI is decreased by 1 (S24). Returning to step S20, the following process is repeated.

If the count value is larger than +m at step S21 (S21, >+m), MIN/MAX Detector 29 determines whether or not the value of VDL_TAP/VDL_PI calculated by ADDER 23 exceeds the value of VDL CODE_H stored in Register (H) 27 (S25).

If the value of VDL CODE_H is exceeded (S25, Yes), ADDER 23 performs a process (CODE JUMP) of decreasing the value of VDL_TAP/VDL_PI by (VDL CODE_H)−(VDL CODE_L)+1 (S26). Returning to step S20, the following process is repeated.

On the other hand, if the value of VDL CODE_H is not exceeded (S25, No), the value of VDL_TAP/VDL_PI is increased by 1 (S27). Then, returning to step S20, the following process is repeated.

Furthermore, if the count value is within the range of −m to +m at step S21, it is determined that there is no difference between DATA and CLOCK in frequency. Without changing the value of VDL_TAP/VDL_PI (S28), assuming that DATA and VDL output are matched in phase (S29), the process ends.

Figure 4A:
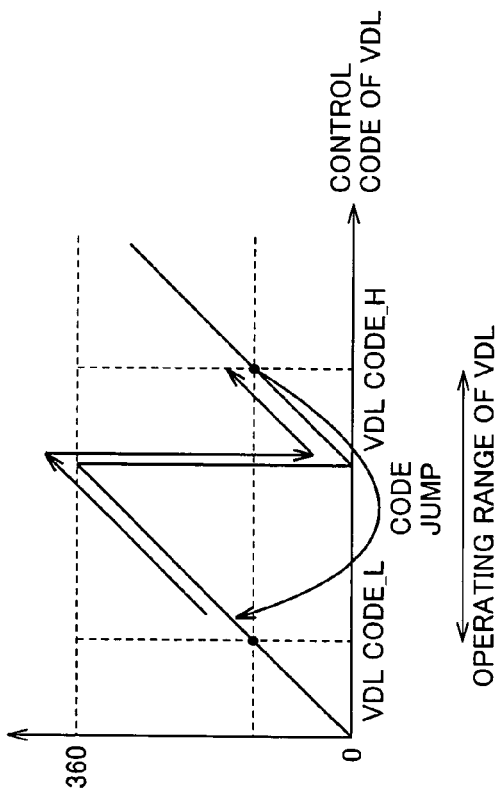
FIGS. 4A and 4B illustrate how VDL 11 follows data equal to or longer than a variable delay time through the process shown in the flowchart in FIG. 3.
Figure 4B:
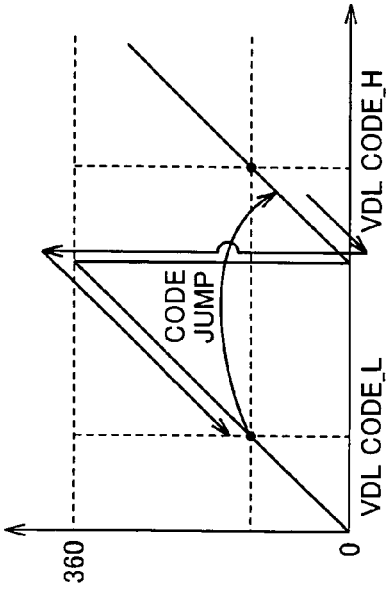

FIGS. 4A and 4B illustrate how VDL 11 follows data equal to or longer than a variable delay time through the process shown in the flowchart in FIG. 3. FIG. 4A shows that as a result of a phase comparison between DATA and VDL output, the count value is successively smaller than −m. In this state, the value of VDL_TAP/VDL_PI eventually reaches VDL CODE_L, so that (VDL CODE_H)−(VDL CODE_L)−1 is added to increase the delay at a time with application of the same clock phase.

FIG. 4B shows that as a result of a phase comparison between DATA and VDL output, the count value is successively larger than +m. In this state, the value of VDL_TAP/VDL_PI eventually reaches VDL CODE_H, so that (VDL CODE_H)−(VDL CODE_L)+1 is subtracted to decrease the delay at a time with application of the same clock phase.

This operation (CODE JUMP) can realize synchronization between DATA and CLOCK while keeping the phase continuity, even when there is a difference in frequency between DATA and CLOCK.

As described above, according to CDR circuit 1 in this embodiment, when MIN/MAX Decoder 29 detects that a control code exceeds the lower limit value or the upper limit value, ADDER 23 performs an addition/subtraction of a control code corresponding to one period of CLOCK to/from a control code. Therefore, it becomes possible to synchronize DATA and CLOCK while applying the same clock phase, even when there is a difference in frequency between DATA and CLOCK.

Moreover, it becomes possible to configure the CDR circuit in a simple circuit configuration since a two phase internal clocks need not be generated. In addition, an eight-phase clock divider having a through current path is no longer necessary.

Second Embodiment

Figure 5:
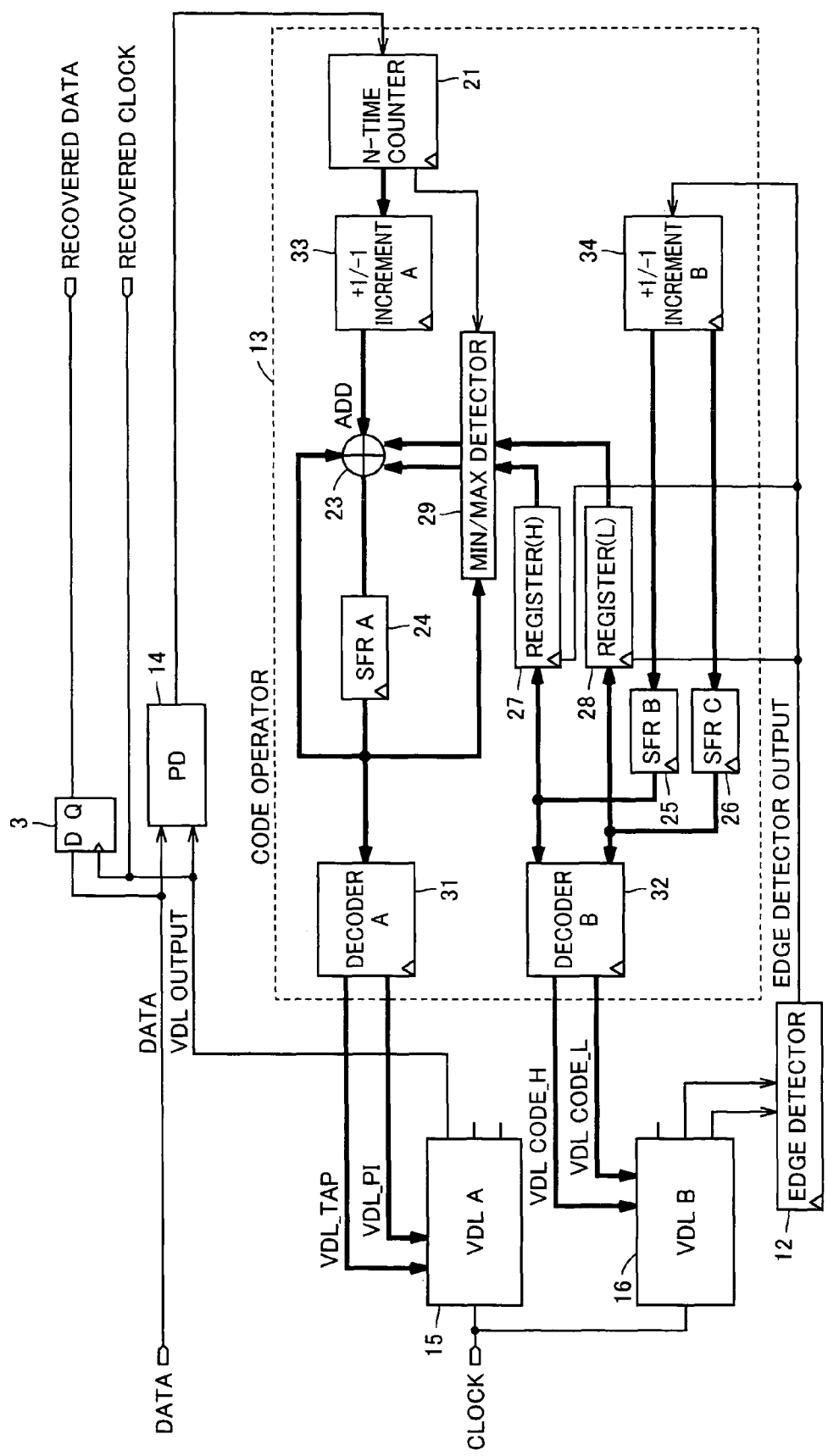
FIG. 5 is a block diagram showing an internal configuration of a CDR circuit in a second embodiment of the present invention.

FIG. 5 is a block diagram showing an internal configuration of a CDR circuit in a second embodiment of the present invention. This CDR circuit differs from the CDR circuit in the first embodiment as shown in FIG. 2 only in that VDL 11 is replaced by a VDL A15 and a VDL B16, +1/−1 Increment circuit 22 is replaced by +1/−1 Increment A circuit 33 and a +1/−1 Increment B circuit 34, and Decoder 30 is replaced by a Decoder A31 and a Decoder B32. Therefore, detailed description of the overlapping configuration and function will not be repeated.

+1/−1 Increment A circuit 33 outputs to ADDER 23 a signal incrementing a control code (VDL_TAP/VDL_PI) for controlling VDL A15 by 1 if the count value of N-time Counter 21 is larger than m (m<<N). On the other hand, +1/−1 Increment A circuit 33 outputs to ADDER 23 a signal decrementing a control code for controlling VDL A15 by 1 if the count value of N-time Counter 21 is smaller than −m.

+1/−1 Increment B circuit 34 receives Edge Detector output from Edge Detector 12, increments VDL CODE_H and decrements VDL CODE_L to output the results to SFR B25 and SFR C26, respectively.

Decoder A31 decodes the control code (VDL_TAP/VDL_PI) output from SFR A24 to generate and output VDL_TAP signal and VDL_PI signal to VDL A15.

Decoder B32 decodes VDL CODE_H and VDL CODE_L output from SFR B25 and SFR C26 to output the decode result to VDL B16.

VDL A15 receives VDL_TAP and VDL_PI to control the delay of VDL output. VDL B 16 receives VDL CODE_H and VDL CODE_L to control generation of a control code corresponding to one period of CLOCK.

In this embodiment, CDRMODE is not used, and Edge Detector 12 always performs detection of one period of CLOCK. Therefore, the upper limit value of VDL CODE_H and the lower limit value of VDL CODE_L stored in Register (H) 27 and Register (L) 28 are updated as appropriate.

Figure 6:
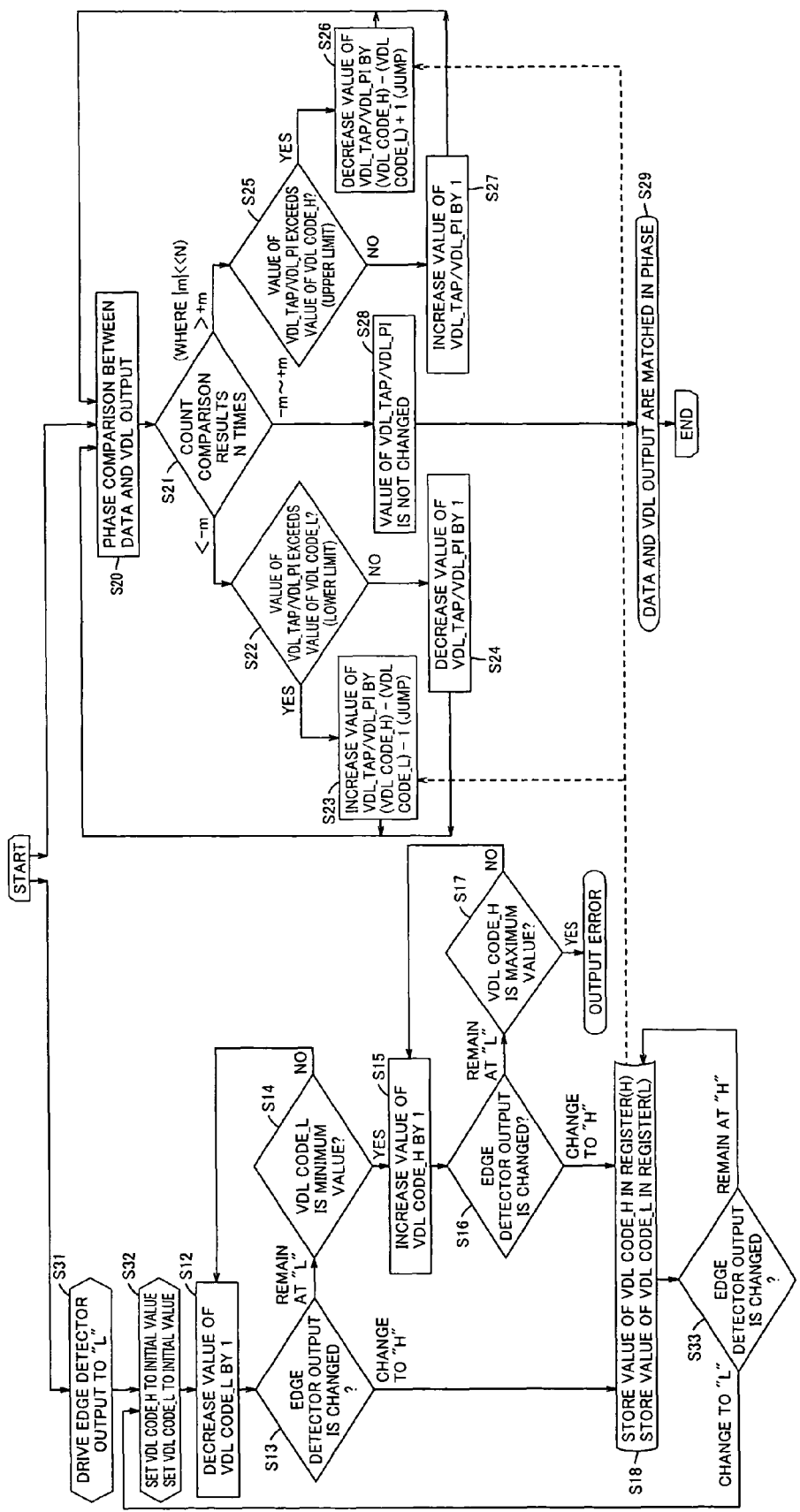
FIG. 6 is a flowchart illustrating a process procedure of CDR circuit 1 in the second embodiment of the present invention.

FIG. 6 is a flowchart illustrating a process procedure of CDR circuit 1 in the second embodiment of the present invention. In this flowchart, the process of performing detection and storage of a control code corresponding to one period of CLOCK and the process of performing synchronization between DATA and CLOCK are concurrently performed.

First, the output of Edge Detector 12 is driven to "L" (S31), and VDL CODE_H and VDL CODE_L in +1/−1 Increment B circuit 34 are set to initial values (S32). Then, the similar process as steps S12-S18 in the flowchart shown in FIG. 3 is performed. Here, if the output of Edge Detector 12 remains at "H" (S33, remain at "H"), the process at step S118 is repeated. On the other hand, if the output of Edge Detector 12 changes to "L" (S33, change to "L"), returning to step S32, the following process is repeated.

Meanwhile, concurrently with these processes, the process at steps S20-S29 shown in FIG. 3 is performed. It is noted that the values of VDL CODE_H and VDL CODE_L used at steps S23 and S26 are updated as appropriate at step S18.

As described above, according to CDR circuit 1 in the present embodiment, the process of detecting a control code corresponding to one period of CLOCK and the process of synchronizing DATA and CLOCK are concurrently performed. Therefore, in addition to the effect as described in the first embodiment, it becomes possible to realize synchronization between DATA and CLOCK while keeping the phase continuity even when a control code corresponding to one period of CLOCK during operation is changed by variations of process, power supply voltage, temperature, and the like.

Third Embodiment

Figure 7:
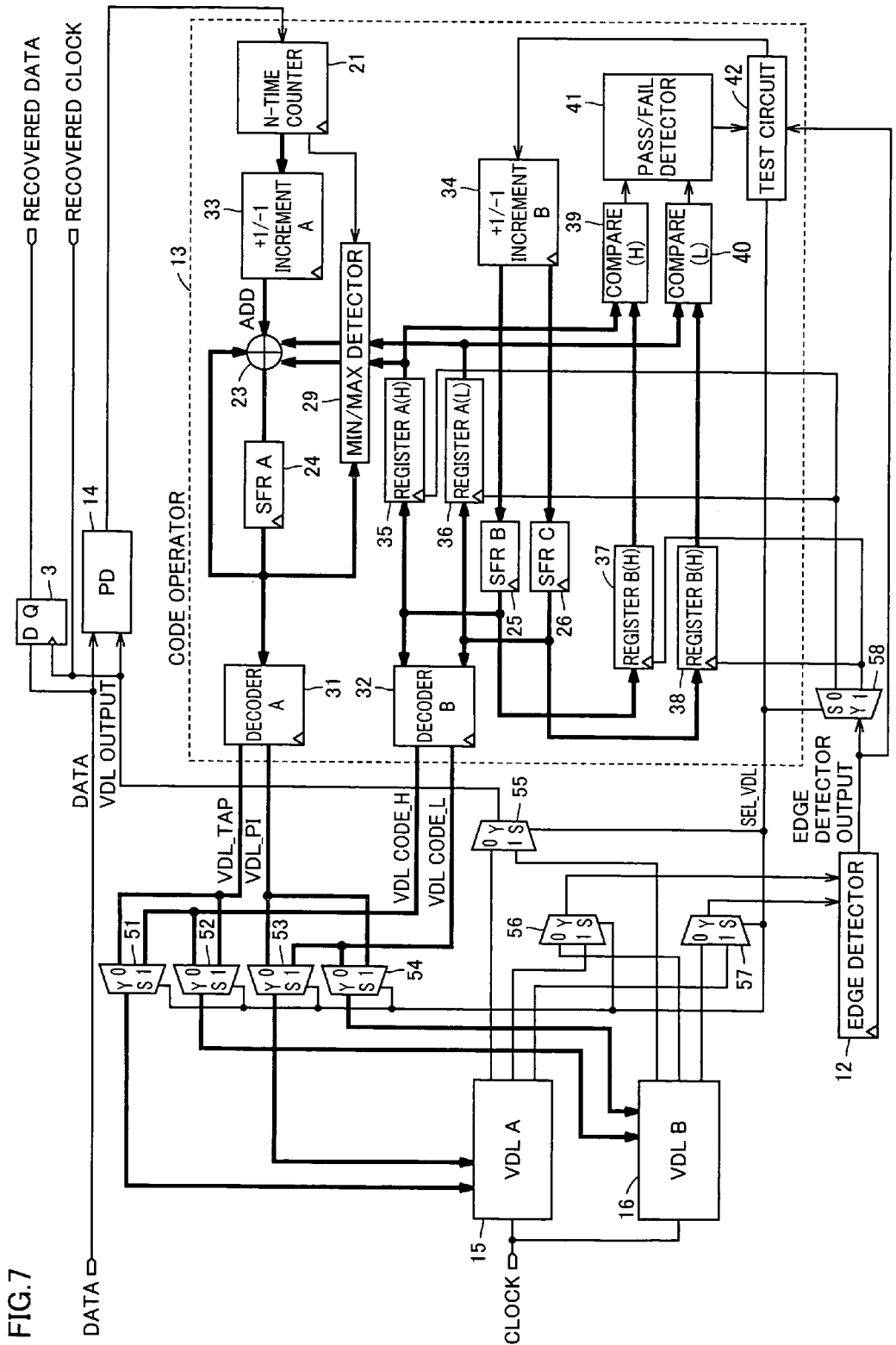
FIG. 7 is a block diagram showing an internal configuration of a CDR circuit in a third embodiment of the present invention.

FIG. 7 is a block diagram showing an internal configuration of a CDR circuit in a third embodiment of the present invention. This CDR circuit differs from the CDR circuit in the second embodiment as shown in FIG. 5 only in that Register (H) 27 and Register (L) 28 are replaced by a Register A (H) 35 and a Register A (L) 36, and a Register B (H) 37, a Register B (L) 38, a Compare (H) circuit 39, a Compare (L) circuit 40, a PASS/FAIL Detector 41, a Tester Circuit 42, and selectors 51-58 are added. Therefore, detailed description of the overlapping configuration and function will not be repeated.

The upper limit value and the lower limit value of a control code in use of VDL B 16 are stored in Register A (H) 35 and Register A (L) 36. Furthermore, the upper limit value and the lower limit value of a control code in use of VDL A1 5 are stored in Register B (H) 37 and Register B (L) 38.

Compare (H) circuit 39 makes a comparison between the upper limit values of control codes stored in Register A (H) 35 and Register B (H) 37. Furthermore, Compare (L) circuit 40 makes a comparison between the lower limit values of control codes stored in Register A (L) 36 and Register B (L) 38.

PASS/FAIL Detector 41 continues the operation of CDR circuit 1 when both the comparison result of Compare (H) 39 and the comparison result of Compare (L) 40 indicate agreement. On the other hand, PASS/FAIL Detector 41 outputs ERROR signal to stop the operation of CDR circuit 1 when both or either of the comparison result of Compare (H) 39 and the comparison result of Compare (L) 40 indicates disagreement.

Test Circuit 42 switches among the outputs of selectors 51-58 based on SEL_VDL signal. If SEL_VDL signal is at "L", Test Circuit 42 allows VDL A15 to perform synchronization between DATA and CLOCK and allows VDL B16 to perform detection and storage of a control code corresponding to one period of CLOCK. If SEL_VDL signal is at "H", Test Circuit 42 allows VDL A1 5 to perform detection and storage of a control code corresponding to one period of CLOCK. It is noted that if an error is detected by PASS/FAIL Detector 41, Edge Detector output to +1/−1 Increment B circuit 34 is stopped to stop the operation of CDR circuit 1.

Figure 8:
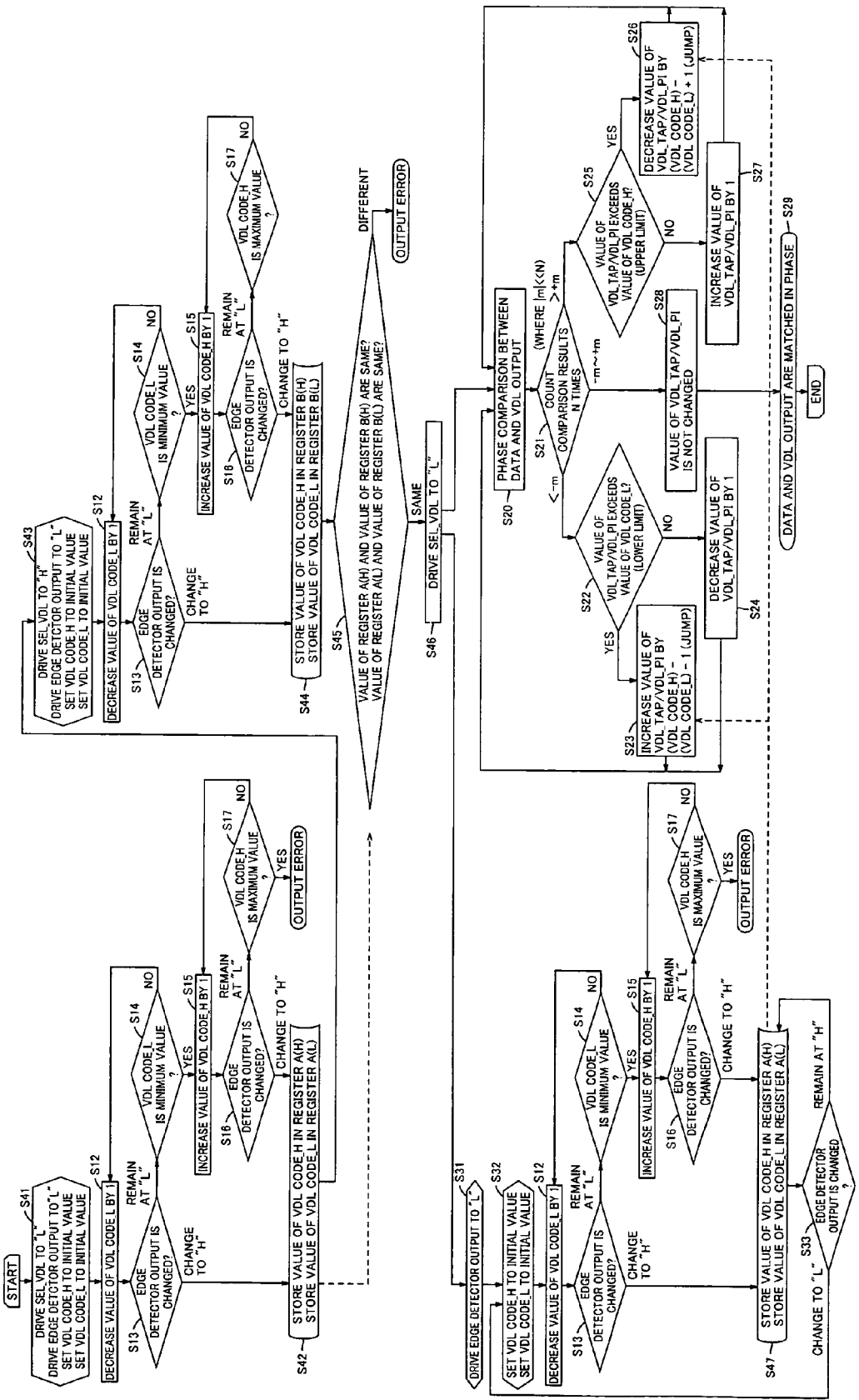
FIG. 8 is a flowchart illustrating a process procedure of CDR circuit 1 in the third embodiment of the present invention.

FIG. 8 is a flowchart illustrating a process procedure of CDR circuit 1 in the third embodiment of the present invention. First, Test Circuit 42 sets SEL_VDL signal to "L" and drives the output of Edge Detector 12 to "L". Then, VDL CODE_H and VDL CODE_L in +1/−1 Increment B circuit 34 are set to initial values (S41).

Then, the similar process as steps S12-S17 in the flowchart shown in FIG. 3 is performed, so that a control code corresponding to one period of CLOCK is detected, and the value of VDL CODE_H and the value of VDL CODE_L at this point are stored in Register A (H) 35 and Register A (L) 36, respectively (S42).

Then, Test Circuit 42 sets SEL_VDL signal to "H" and drives the output of Edge Detector 12 to "L". Then, VDL CODE_H and VDL CODE_L in +1/−1 Increment B circuit 34 are set to initial values (S43).

Then, the similar process as steps S12-S17 in the flowchart shown in FIG. 3 is performed, so that a control code corresponding to one period of CLOCK is detected, and the value of VDL CODE_H and the value of VDL CODE_L at this point are stored in Register B (H) 37 and Register B (L) 38, respectively (S44).

Then, the value of Register A (H) 35 and the value of Register B (H) 37 are compared with each other, and the value of Register A (L) 36 and the value of Register B (L) 38 are compared with each other. If either or both of the comparison results indicate disagreement (S45, different), ERROR signal is output. The process then ends.

On the other hand, if both of the comparison results indicate agreement (S45, same), Test Circuit 42 drives SEL_VDL signal to "L" (S46), drives the output of Edge Detector 12 to "L" (S31), and sets VDL CODE_H and VDL CODE_L in +1/−1 Increment B circuit 34 to initial values (S32). Then, the similar process as steps S12-S17 in the flowchart as shown in FIG. 3 is performed, so that a control corresponding to one period of CLOCK is detected, and then the value of VDL CODE_H and the value of VDL CODE_L at this point are stored in Register A (H) 35 and Register A (L) 36, respectively (S47). Here, if the output of Edge Detector 12 remains at "H" (S33, remain at "H"), the process at step S47 is repeated. On the other hand, if the output of Edge Detector 12 changes to "L" (S33, change to "L"), returning to step S32, the following process is repeated.

Meanwhile, concurrently with those processes, the process at steps S20-S29 shown in FIG. 3 is performed. It is noted that the values of VDL CODE_H and VDL CODE_L used at steps S23 and S26 are updated as appropriate at step S47.

As described above, according to CDR circuit 1 in the present embodiment, VDL A15 and VDL B 16 are used to detect the respective control codes corresponding to one period of CLOCK, and the agreement is confirmed before operating CDR circuit 1, thereby ensuring that the characteristic of VDL B 16 detecting a control code corresponding to one period of CLOCK and the characteristic of VDL A15 synchronizing DATA and CLOCK are the same. Thus, it becomes possible to realize synchronization between DATA and CLOCK more accurately while keeping the phase continuity.

Fourth Embodiment

Figure 9:
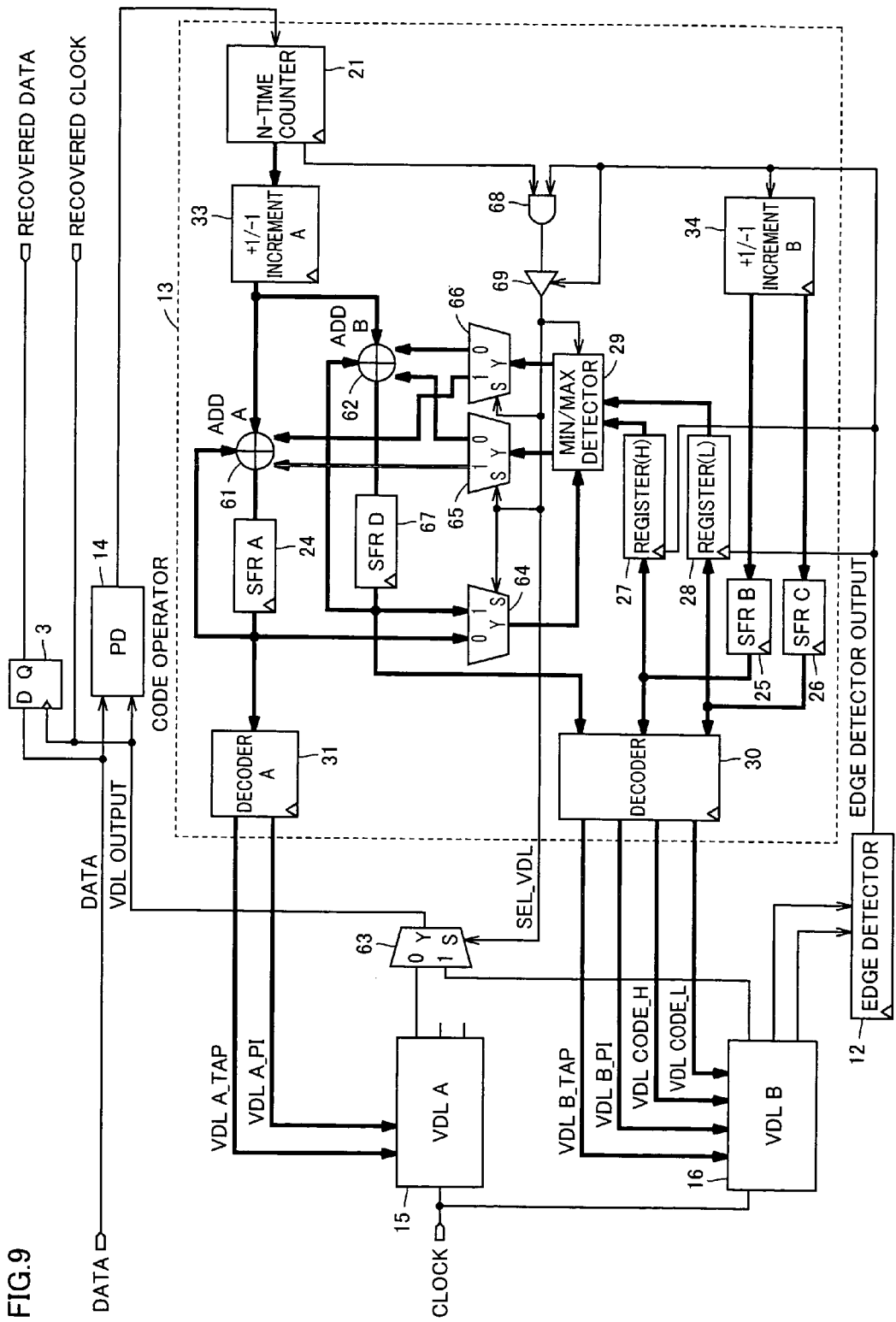
FIG. 9 is a block diagram showing an internal configuration of a CDR circuit in a fourth embodiment of the present invention.

FIG. 9 is a block diagram showing an internal configuration of a CDR circuit in a fourth embodiment of the present invention. This CDR circuit differs from the CDR circuit in the second embodiment shown in FIG. 5 only in that ADDER 23 is replaced by an ADDER A61 and an ADDER B62, Decoder B32 is replaced by a Decoder 30, and selectors 63-66, an SFR D67, an AND circuit 68, and a buffer 69 are added. Therefore, detailed description of the overlapping configuration and function will not be repeated.

AND circuit 68 receives a signal going to "H" during the operation of N-time Counter 21 from N-time Counter 21 and Edge Detector output. Therefore, when Edge detector output changes, SEL_VDL as the output of buffer 69 changes.

When SEL_VDL is at "L", VDL output from VDL A15 is applied to PD 14 and the detection result of MIN/MAX Detector 29 is applied to ADDER B62. Therefore, VDL A15 performs synchronization between DATA and CLOCK.

On the other hand, when SEL_VDL is at "H", VDL output from VDL B16 is applied to PD 14 and the detection result of MIN/MAX Detector 29 is applied to ADDER A61. Therefore, VDL B16 perforns synchronization between DATA and CLOCK.

Figure 10:
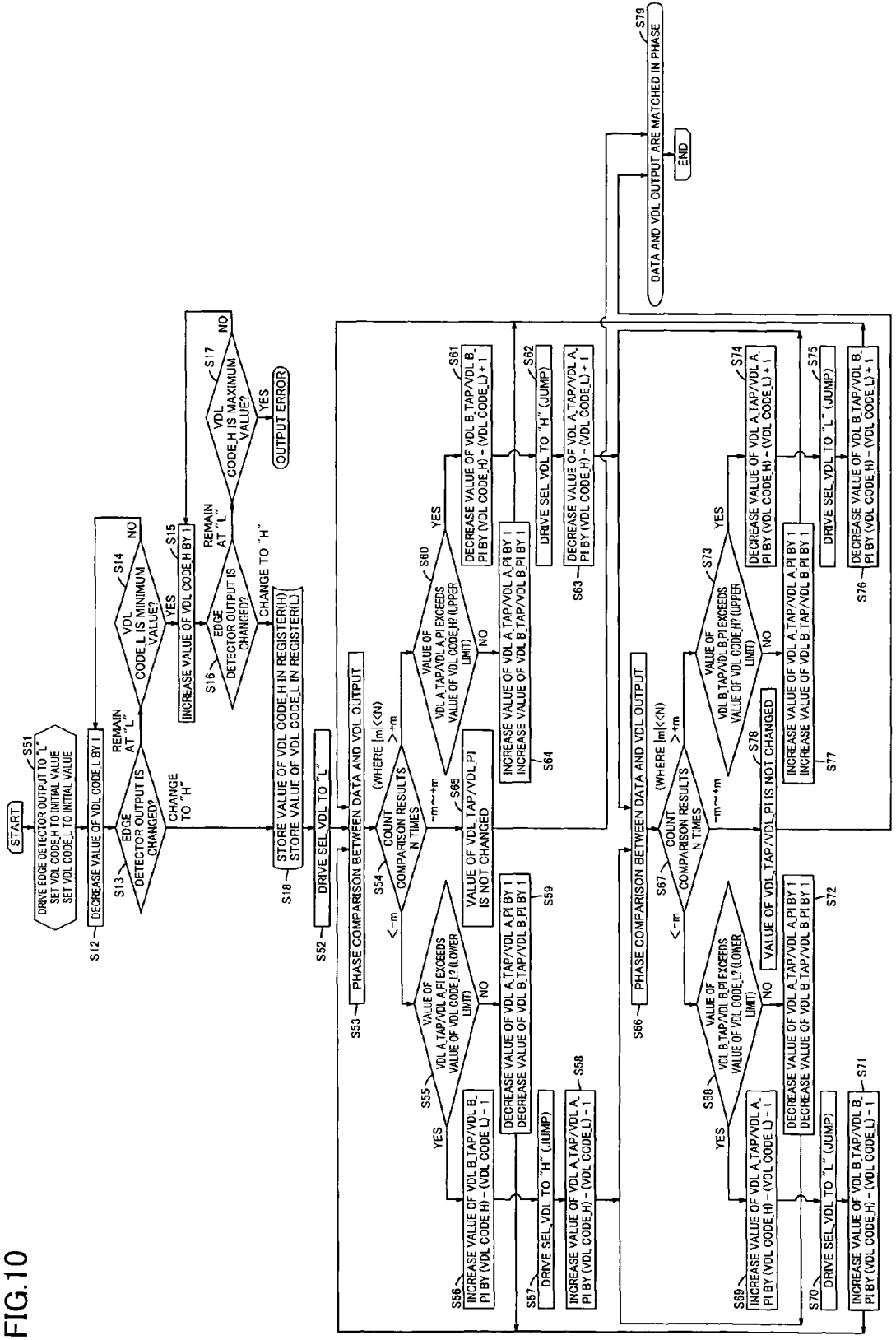
FIG. 10 is a flowchart illustrating a process procedure of CDR circuit 1 in the fourth embodiment of the present invention.

FIG. 10 is a flowchart illustrating a process procedure of CDR circuit 1 in the fourth embodiment of the present invention. First, the output of Edge Detector 12 is driven to "L", and VDL CODE_H and VDL CODE_L in +1/−1 Increment B circuit 34 are set to initial values (S51). Then, the similar process as steps S12-S15 in the flowchart shown in FIG. 3 is performed.

Then, the output of Edge Detector 12 is driven to "L" to drive SEL_VDL to "L" (S52), and PD 14 makes a phase comparison between DATA and VDL output (S53). N-time Counter 21 counts the phase comparison results from PD 14 N times. If the count value is smaller than −m (S54, <−m), MIN/MAX Detector 29 determines whether or not the value of VDL A_TAP/VDL A_PI calculated by ADDER A61 exceeds the value of VDL CODE_L stored in Register (L) 28 (S55).

If the value of VDL CODE_L is exceeded (S55, Yes), ADDER B62 performs a process of increasing the value of VDL B_TAP/VDL B_PI by (VDL CODE_H)−(VDL CODE_L)−1 (S56) and drives SEL_VDL to "H" (S57). Then, ADDER A61 performs a process of increasing the value of VDL A_TAP/VDL A_PI by (VDL CODE_H)−(VDL CODE_L)−1 (S58), and the process proceeds to step S66.

On the other hand, if the value of VDL CODE_L is not exceeded (S55, No), the value of VDL A_TAP/VDL A_PI is decreased by 1, and the value of VDL B_TAP/VDL B_PI is decreased by 1 (S59). Then, returning to step S53, the following process is repeated.

If the count value is larger than +m at step S54 (S54, >+m), MIN/MAX Detector 29 determines whether or not the value of VDL A_TAP/VDL A_PI calculated by ADDER A61 exceeds the value of VDL CODE_H stored in Register (H) 27 (S60).

If the value of VDL CODE_H is exceeded (S60, Yes), ADD B62 performs a process of decreasing the value of VDL B_TAP/VDL B_PI by (VDL CODE_H)−(VDL CODE_L)+1 (S61) and drives SEL_VDL to "H" (S62). Then, ADD A61 performs a process of decreasing the value of VDL A_TAP/ VDL A_PI by (VDL CODE_H)−(VDL CODE_L)+1 (S63), and the process proceeds to step S66.

On the other hand, if the value of VDL CODE_H is not exceeded (S60, No), the value of VDL A_TAP/VDL A_PI is increased by 1, and the value of VDL B_TAP/VDL B_PI is increased by 1 (S64). Returning to step S53, the following process is repeated.

Furthermore, if the count value is within the range of −m to +m at step S54, it is determined that there is no difference between DATA and CLOCK in frequency. Without changing the value of VDL_TAP/VDL_PI (S65), assuming that DATA and VDL output are matched in phase (S79), the process ends.

At step S66, PD 14 makes a phase comparison between DATA and VDL output. N-time Counter 21 counts the phase comparison results from PD 14 N times. If the count value is smaller than −m (S67, <−m), MIN/MAX Detector 29 determines whether or not the value of VDL B_TAP/VDL B_PI calculated by ADDER B62 exceeds the value of VDL CODE_L stored in Register (L) 28 (S68).

If the value of VDL CODE_L is exceeded (S68, Yes), ADDER A61 performs a process of increasing the value of VDL A_TAP/VDL A_PI by (VDL CODE_H)−(VDL CODE_L)−1 (S69) and drives SEL_VDL to "L" (S70). Then, ADDER B62 performs a process of increasing the value of VDL B_TAP/VDL B_PI by (VDL CODE_H)−(VDL CODE_L)−1 (S71). Then, returning to step S53, the following process is repeated.

On the other hand, if the value of VDL CODE_L is not exceeded (S68, No), the value of VDL A_TAP/VDL A_PI is decreased by 1 and the value of VDL B_TAP/VDL B_PI is decreased by 1 (S72). Then, returning to step S66, the following process is repeated.

If the count value is larger than +m at step S67 (S67, >+m), MIN/MAX Detector 29 determines whether or not the value of VDL B_TAP/VDL B_PI calculated by ADDER B62 exceeds the value of VDL CODE_H stored in Register (H) 27 (S73).

If the value of VDL CODE_H is exceeded (S73, Yes), ADDER A61 performs a process of decreasing the value of VDL A_TAP/VDL A_PI by (VDL CODE_H)−(VDL CODE_L)+1 (S74) and drives SEL_VDL to "L" (S75). Then, ADDER B62 performs a process of decreasing the value of VDL B_TAP/VDL B_PI by (VDL CODE_H)−(VDL CODE_L)+1 (S76). Then, returning to step S53, the following process is repeated.

On the other hand, if the value of VDL CODE_H is not exceeded (S73, No), VDL A_TAP/VDL A_PI is increased by 1 and the value of VDL B_TAP/VDL B_PI is increased by 1 (S77). Then, returning to step S66, the following process is repeated.

Furthermore, if the count value is within the range of −m to +m at step S67, it is determined that there is no difference in frequency between DATA and CLOCK. Without changing the value of VDL_TAP/VDL_PI (S78), assuming that DATA and VDL output are matched in phase (S79), the process ends.

Figure 11A:
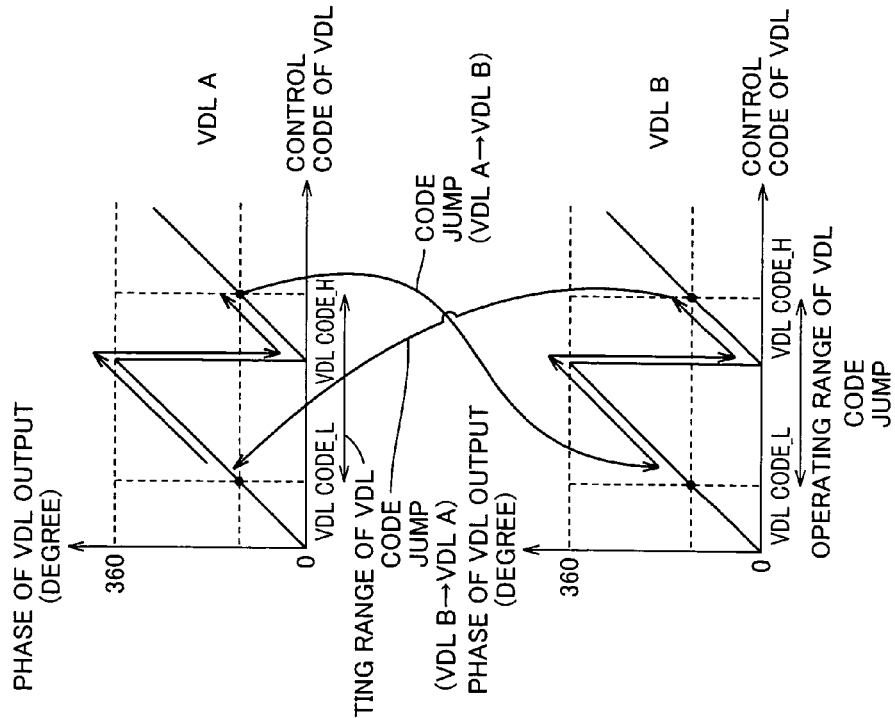
FIGS. 11A and 11B illustrate how VDL A 15 and VDL B 16 follow data equal to or longer than a variable delay time through the process shown in the flowchart in FIG. 10.
Figure 11B:
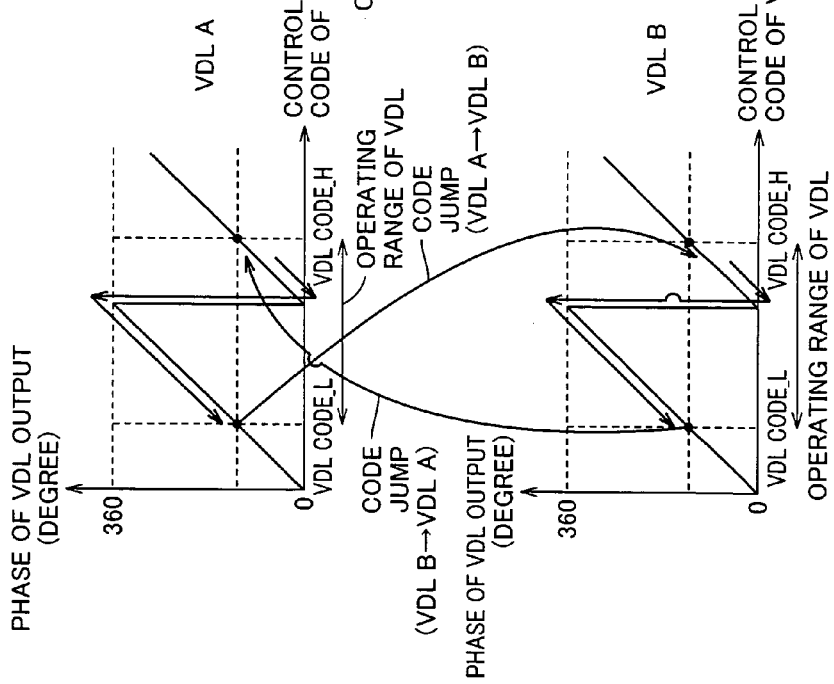

FIGS. 11A and 11B illustrate how VDL A15 and VDL B16 follow data equal to or longer than a variable delay time through the process shown in the flowchart in FIG. 10. FIG. 11A shows that the count value is successively smaller than −m as a result of a phase comparison between DATA and VDL output. In the upper graph in FIG. 11A, VDL A15 synchronizes DATA and CLOCK, and the value of VDL A_TAP/VDL A_PI eventually reaches VDL CODE_L. At this point, as shown in the lower graph in FIG. 11A, after (VDL CODE_H)−(VDL CODE_L)−1 is added to the value of VDL B_TAP/VDL B_PI, the operation is switched to VDL B16 for synchronization between DATA and CLOCK. In addition, (VDL CODE_H)-(VDL CODE_L)-1 is added to the value of VDL A_TAP/VDL A_PI, so that the delay is increased at a time with application of the same clock phase.

Furthermore, as shown in the lower graph in FIG. 11A, VDL B16 synchronizes DATA and CLOCK, and when the value of VDL B_TAP/VDL B_PI eventually reaches VDL CODE_L, as shown in the upper graph in FIG. 11A, (VDL CODE_H)-(VDL CODE_L)-1 is added to the value of VDL A_TAP/VDL A_PI. Thereafter, the operation is switched to VDL A15 for synchronization between DATA and CLOCK. In addition, (VDL CODE_H)-(VDL CODE_L)-1 is added to the value of VDL B_TAP/VDL B_PI, so that the delay is increased at a time with application of the same clock phase.

FIG. 11B shows that the count value is successively larger than +m as a result of a phase comparison between DATA and VDL output. In the upper graph in FIG. 11B, VDL A15 synchronizes DATA and CLOCK, and the value of VDL A_TAP/VDL A_PI eventually reaches VDL CODE_H. At this point, as shown in the lower graph in FIG. 11B, after (VDL CODE_H)-(VDL CODE_L)+1 is subtracted from the value of VDL B_TAP/VDL B_PI, the operation is switched to VDL B16 for synchronization between DATA and CLOCK. In addition, (VDL CODE_H)-(VDL CODE_L)+1 is subtracted from the value of VDL A_TAP/VDL A_PI, so that the delay is reduced at a time with application of the same clock phase.

As shown in the lower diagram in FIG. 11B, VDL B16 synchronizes DATA and CLOCK, and when the value of VDL_B TAP/VDL B_PI eventually reaches VDL CODE_H, as shown in the upper graph in FIG. 11B, (VDL CODE_H)-(VDL CODE_L)+1 is subtracted from the value of VDL A_TAP/VDL A_PI. Thereafter, the operation is switched to VDL A15 for synchronization between DATA and CLOCK. In addition, (VDL CODE_H)-(VDL CODE_L)+1 is subtracted from the value of VDL B_TAP/VDL B_PI, so that the delay is reduced at a time with application of the same clock phase.

This operation (CODE JUMP) can realize synchronization between DATA and CLOCK while keeping the phase continuity even when there is a difference in frequency between DATA and CLOCK.

As described above, according to CDR circuit 1 in the present embodiment, when the value of VDL_TAP/VDL_PI reaches the lower limit value or the upper limit value, VDL is switched for synchronization between DATA and CLOCK. Therefore, it becomes possible to keep the phase continuity even when an addition or subtraction of a control code corresponding to one period of CLOCK requires time.

Fifth Embodiment

Figure 12:
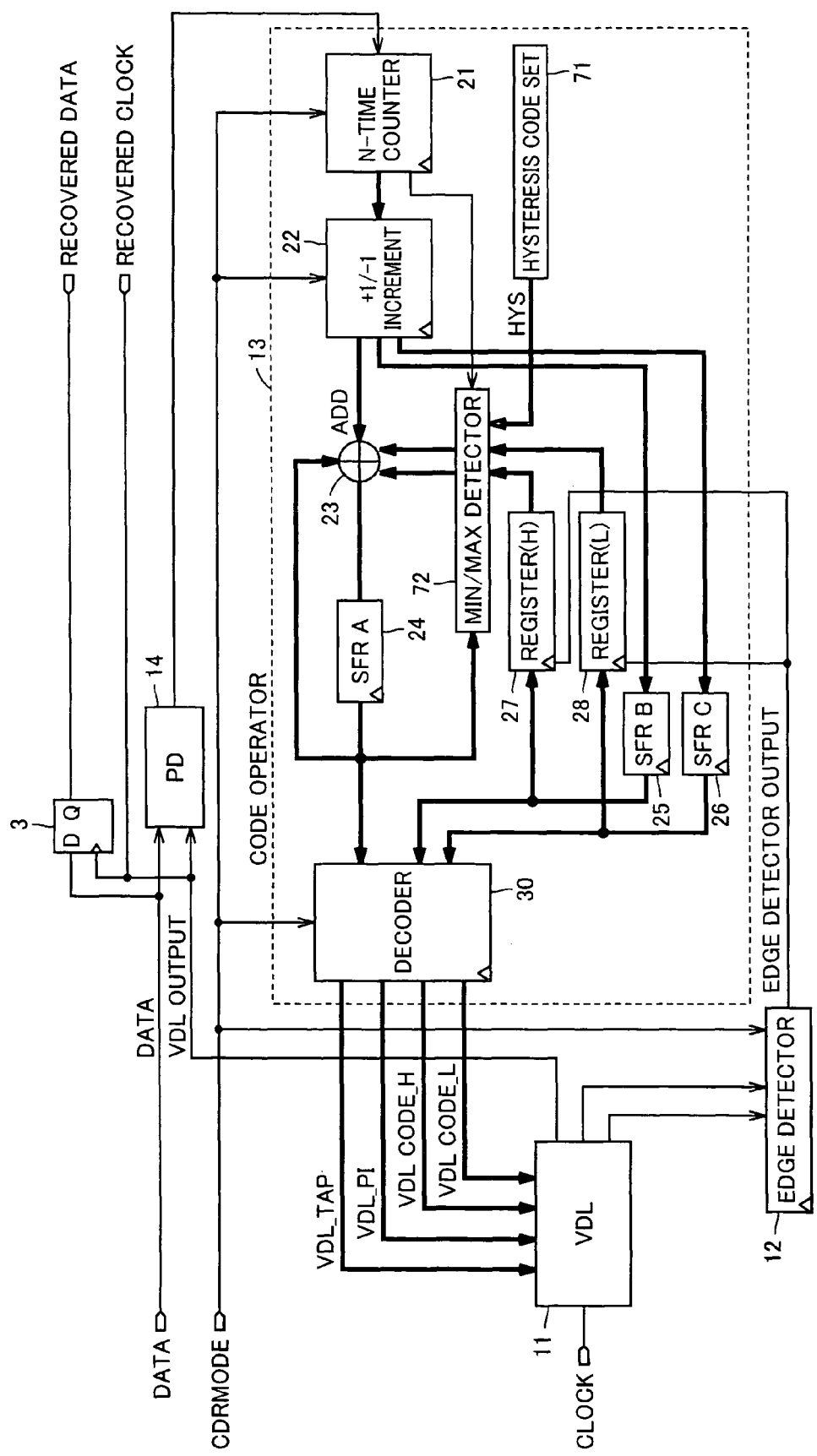
FIG. 12 is a block diagram showing an internal configuration of a CDR circuit in a fifth embodiment of the present invention.

FIG. 12 is a block diagram showing an internal configuration of a CDR circuit in a fifth embodiment of the present invention. This CDR circuit differs from the CDR circuit in the first embodiment shown in FIG. 2 in that a Hysteresis CODE SET circuit 71 is added to decide a hysteresis control code and the function of MIN/MAX Detector 72 is different. Therefore, detailed description of the overlapping configuration and function will not be repeated.

MIN/MAX Detector 72 receives control code (VDL_TAP/VDL_PI) calculated by ADDER 23 through SFR A24 and incorporates HYS signal output from Hysteresis CODE SET circuit 71 when detecting that a control code is the upper limit value stored in Register (H) 27 or the lower limit value stored in Register (L) 28. In other words, the lower limit value of a control code set to (VDL CODE_L)-(HYS) and the upper limit value of a control code set to (VDL CODE_H)+(HYS) are compared with control code (VDL_TAP/VDL_PI).

Figure 13:
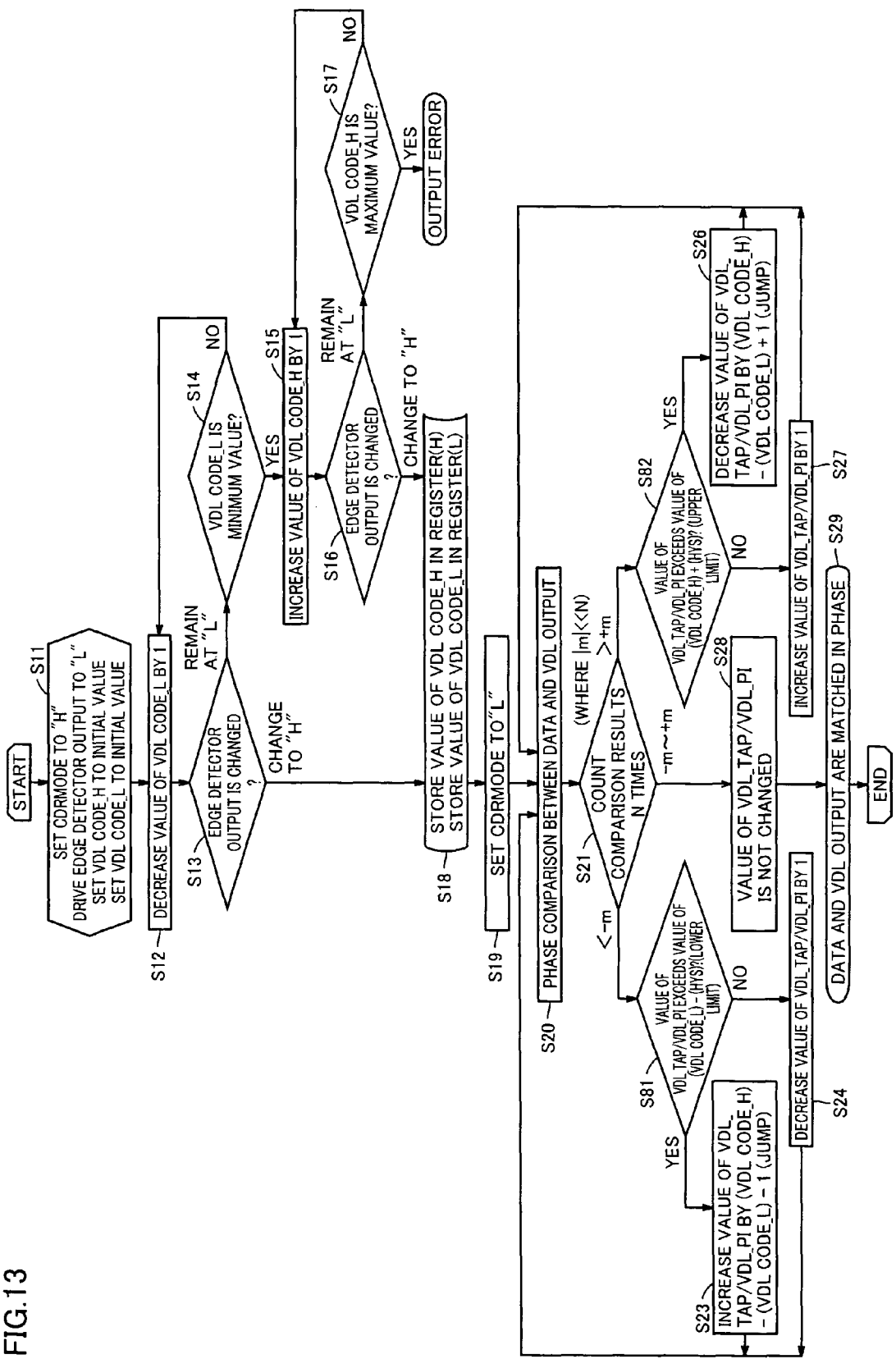
FIG. 13 is a flowchart illustrating a process procedure of the CDR circuit in the fifth embodiment of the present invention.

FIG. 13 is a flowchart illustrating a process procedure of CDR circuit 1 in the fifth embodiment of the present invention. First, the similar process as steps S11-S21 in the flowchart shown in FIG. 3 is performed. N-time Counter 21 counts a phase comparison result from PD 14 N times. If the count value is smaller than −m (S21, <−m), MIN/MAX Detector 72 determines whether or not the value of VDL_TAP/VDL_PI calculated by ADDER 23 exceeds the value of (VDL CODE_L)-(HYS) (S81).

If the value of (VDL CODE_L)-(HYS) is exceeded (S81, Yes), ADDER 23 performs a process (CODE JUMP) of increasing the value of VDL_TAP/VDL_PI by (VDL CODE_H)-(VDL CODE_L)-1 (S23), and returning to step S20, the following process is repeated.

On the other hand, if the value of (VDL CODE_L)-(HYS) is not exceeded (S81, No), the value of VDL_TAP/VDL_PI is decreased by 1 (S24), and returning to step S20, the following process is repeated.

If the count value is larger than +m at step S21 (S21, >+m), MIN/MAX Detector 72 determines whether or not the value of VDL_TAP/VDL_PI calculated by ADDER 23 exceeds the value of (VDL CODE_H)+(HYS) (S82).

If the value of (VDL CODE_H)+(HYS) is exceeded (S82, Yes), ADDER 23 performs a process (CODE JUMP) of decreasing the value of VDL_TAP/VDL_PI by (VDL CODE_H)-(VDL CODE_L)+1 (S26), and returning to step S20, the following process is repeated.

On the other hand, if the value of (VDL CODE_H)+(HYS) is not exceeded (S82, No), the value of VDL_TAP/VDL_PI is increased by 1 (S27), and returning to step S20, the following process is repeated.

Furthermore, if the count value is within the range of −m to +m at step S21, it is determined that there is no difference in frequency between DATA and CLOCK.

Without changing the value of VDL_TAP/VDL_PI (S28), assuming that DATA and VDL output are matched in phase (S29), the process ends.

Figure 14A:
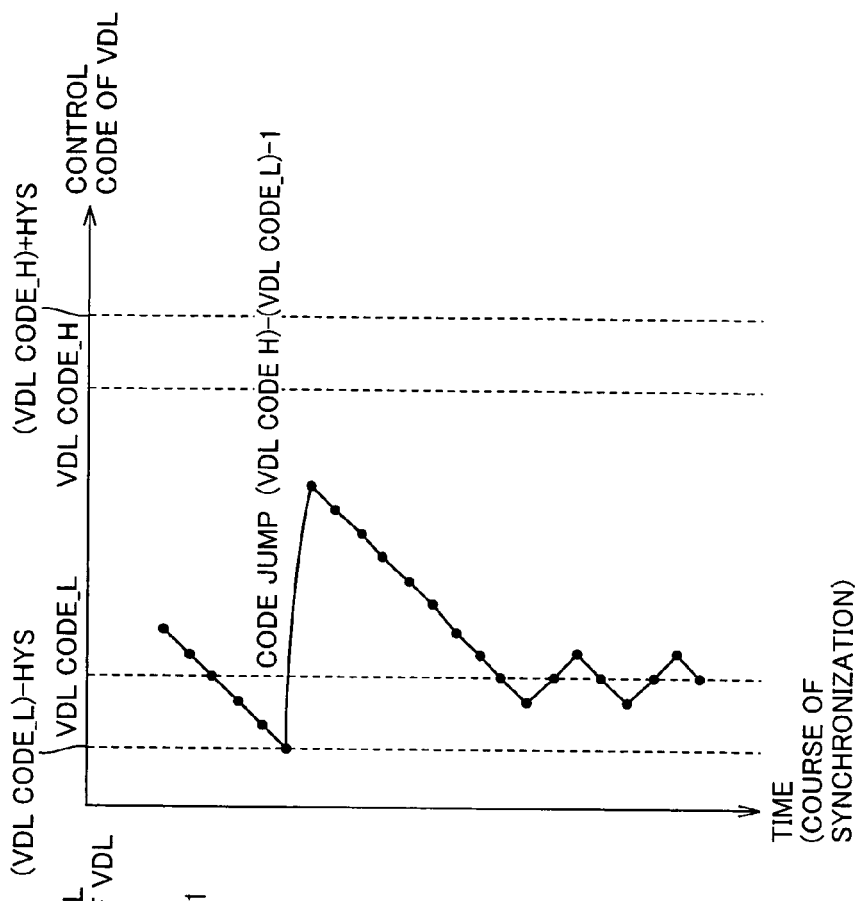
FIGS. 14A and 14B show a comparison between a transition of a control code of VDL 11 in the first embodiment and a transition of a control code of VDL 11 in the fifth embodiment.
Figure 14B:
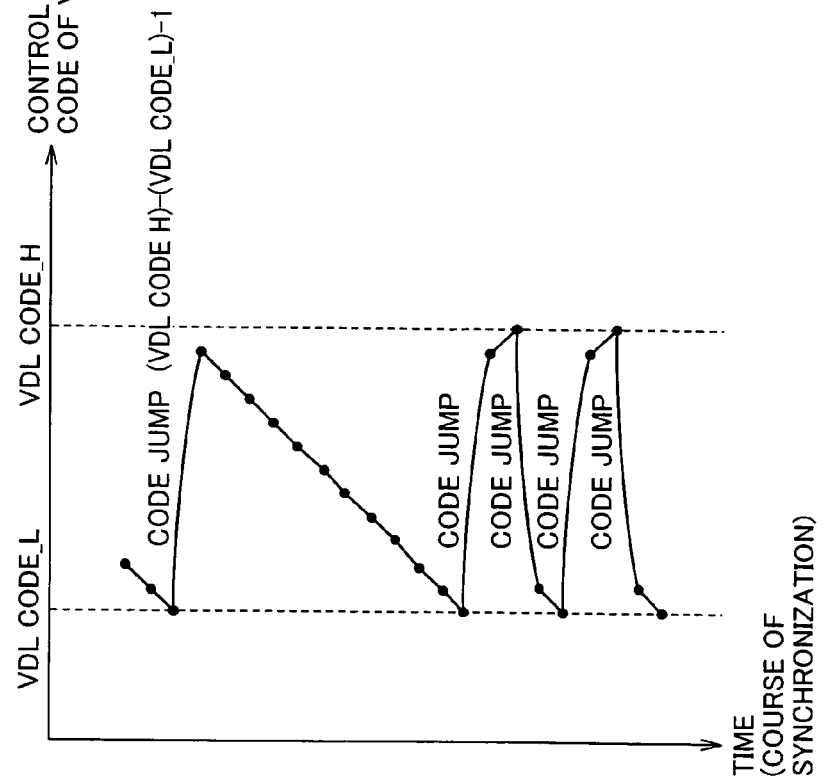

FIGS. 14A and 14B illustrate the comparison between a transition of a control code of VDL 11 in the first embodiment and a transition of a control code of VDL 11 in the fifth embodiment. FIG. 14A shows the case in the first embodiment. Here, when phase synchronization is achieved with a control code in the vicinity of VDL CODE_L, CODE JUMP is produced so that (VDL CODE_H)-(VDL CODE_L)-1 is added to the control code. Thereafter, when the control code is incremented, CODE JUMP is produced again, resulting in that CODE JUMP is frequently repeated.

FIG. 14B shows the case in the fifth embodiment. Here, even when phase synchronization is achieved with a control code in the vicinity of VDL CODE_L, (VDL CODE_L)-(HYS) is set to the lower limit value, thereby preventing CODE JUMP.

As described above, according to CDR circuit 1 in the present embodiment, MIN/MAX Detector 72 takes hysteresis into consideration when making a comparison between the control code and the lower limit value or the upper limit value, so that it becomes possible to prevent CODE JUMP from being frequently produced, even when phase synchronization is achieved with a control code in the vicinity of the lower limit value or the upper limit value.

Sixth Embodiment

Figure 15:
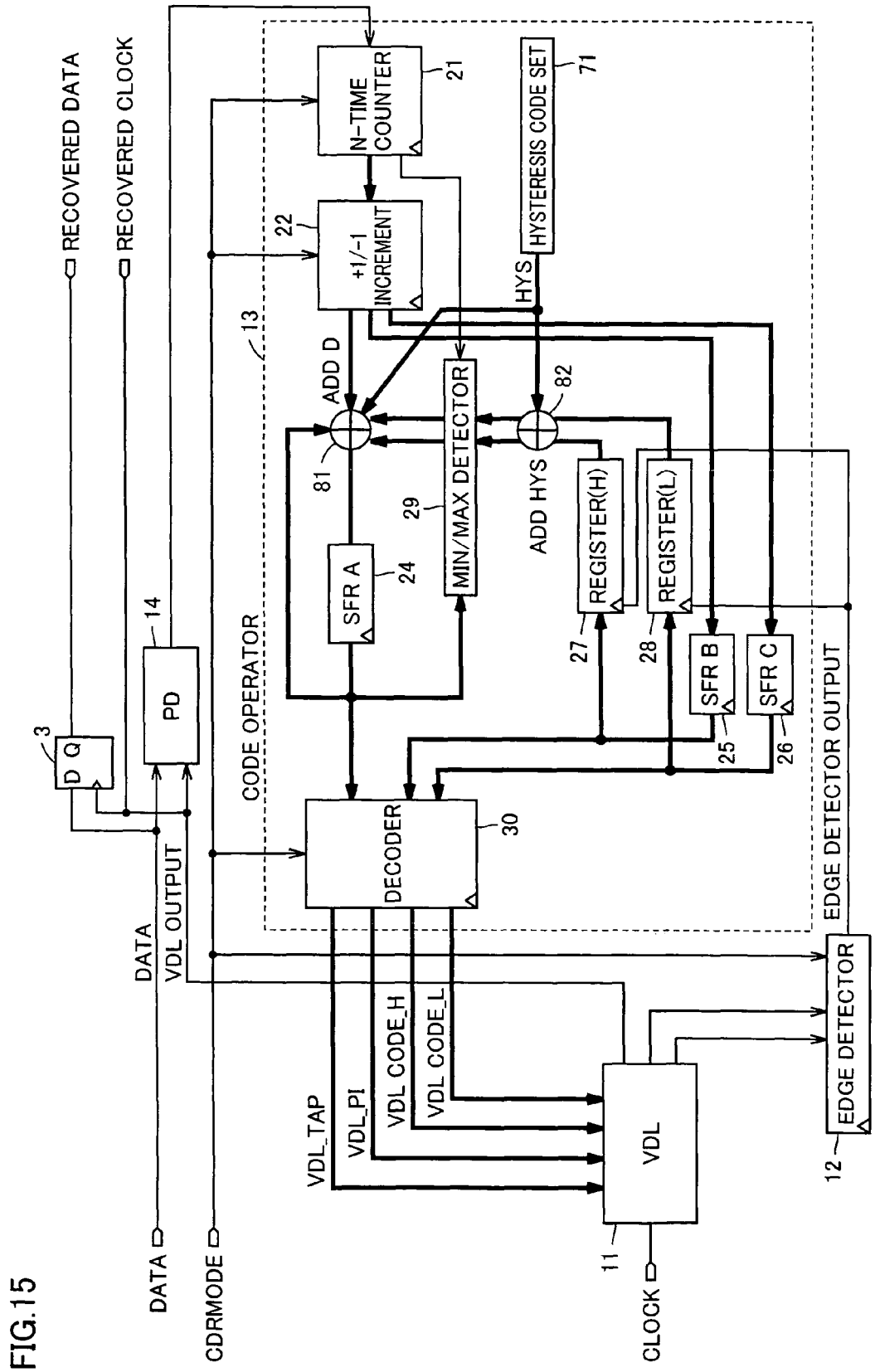
FIG. 15 is a block diagram showing an internal configuration of a CDR circuit in a sixth embodiment of the present invention.

FIG. 15 is a block diagram showing an internal configuration of a CDR circuit in a sixth embodiment of the present invention. This CDR circuit differs from the CDR circuit in the fifth embodiment as shown in FIG. 12 only in that ADDER 23 is replaced by an ADDER D81, an ADDER HYS82 is added, and HYS signal from Hysteresis CODE SET circuit 71 is applied to ADDER D81 and ADDER HYS82. Therefore, detailed description of the overlapping configuration and function will not be repeated. It is noted that the principle of operation is similar as described in the fifth embodiment.

ADDER HYS82 adds the value of HYS to the upper limit value stored in Register (H) 27 and subtracts the value of HYS to the lower limit value stored in Register (L) 28 for output to MIN/MAX Detector 29.

ADDER D81 performs an addition/subtraction of the value of HYS when performing an addition or subtraction of a control code corresponding to one period of CLOCK.

Figure 16:
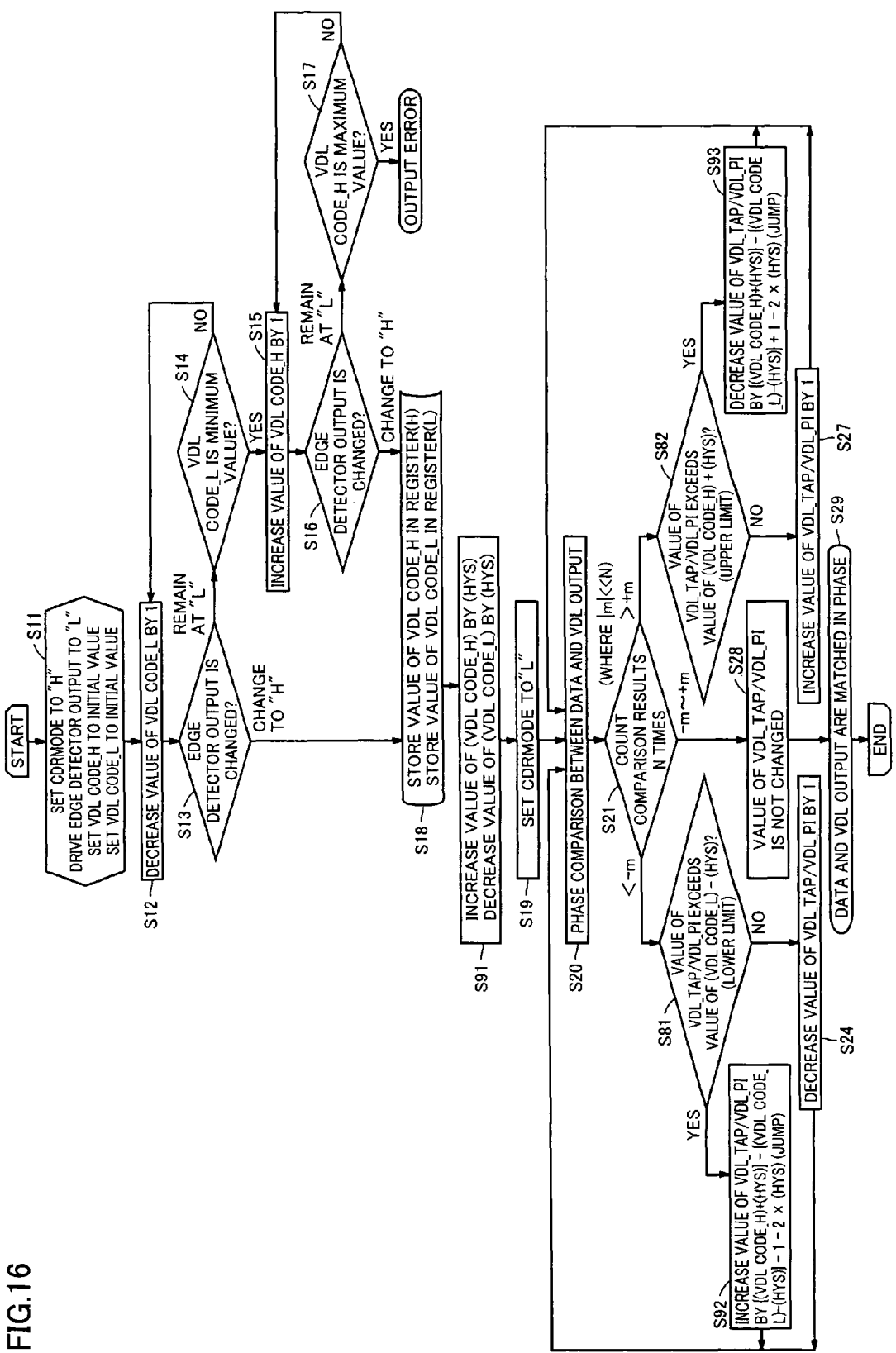
FIG. 16 is a flowchart illustrating a process procedure of the CDR circuit in the sixth embodiment of the present invention.

FIG. 16 is a flowchart illustrating a process procedure of the CDR circuit in the sixth embodiment of the present invention. First, the similar process as steps S11-S18 in the flowchart shown in FIG. 3 is performed. ADDER HYS82 increases the value of VDL CODE_H by the value of HYS and decreases the value of VDL CODE_L by the value of HYS (S91).

Then, CDRMODE is set to "L" (S19), and PD 14 makes a phase comparison between DATA and VDL output (S20). N-time Counter 21 counts the phase comparison results from PD 14 N times. If the count value is smaller than −m (S21, <−m), MIN/MAX Detector 29 determines whether or not the value of VDL_TAP/VDL_PI calculated by ADDER D81 exceeds the value of (VDL CODE_L)−(HYS) (S81).

If the value of (VDL CODE_L)−(HYS) is exceeded (S81, Yes), ADDER 23 performs a process (CODE JUMP) of increasing the value of VDL_TAP/VDL_PI by {(VDL CODE_H)+(HYS)}−{(VDL CODE_L)−(HYS)}−1−2×(HYS) (S92). Then, returning to step S20, the following process is repeated.

On the other hand, if the value of (VDL CODE_L)−(HYS) is not exceeded (S81, No), the value of VDL_TAP/VDL_PI is decreased by 1 (S24). Then, returning to step S20, the following process is repeated.

If the count value is larger than +m at step S21 (S21, >+m), MIN/MAX Detector 29 determines whether or not the value of VDL_TAP/VDL_PI calculated by ADDER D81 exceeds the value of (VDL CODE_H)+(HYS) (S82).

If the value of (VDL CODE_H)+(HYS) is exceeded (S82, Yes), ADDER 23 performs a process (CODE JUMP) of decreasing the value of VDL_TAP/VDL_PI by {(VDL CODE_H)+(HYS)}−{(VDL CODE_L)−(HYS)}+1−2×(HYS) (S93). Then, returning to step S20, the following process is repeated.

On the other hand, if the value of (VDL CODE_H)+(HYS) is not exceeded (S82, No), the value of VDL_TAP/VDL_PI is increased by 1 (S27). Then, returning to step S20, the following process is repeated.

Furthermore, if the count value is within the range of −m to +m at step S21, it is determined that there is no difference in frequency between DATA and CLOCK. Without changing the value of VDL_TAP/VDL_PI (S28), assuming that DATA and VDL output are matched in phase (S29), the process ends.

As described above, according to the CDR circuit in the present embodiment, ADDER HYS82 adds the value of HYS to the upper limit value and subtracts the value of HYS from the lower limit value, and ADDER D81 performs an addition/subtraction of the value of HYS when performing an addition or subtraction of a control code corresponding to one period of CLOCK, thereby achieving the similar effect as described in the fifth embodiment. In addition, as compared with the fifth embodiment, it becomes possible to simplify the circuit configuration of MIN/MAX Detector 29.

Seventh Embodiment

Figure 17:
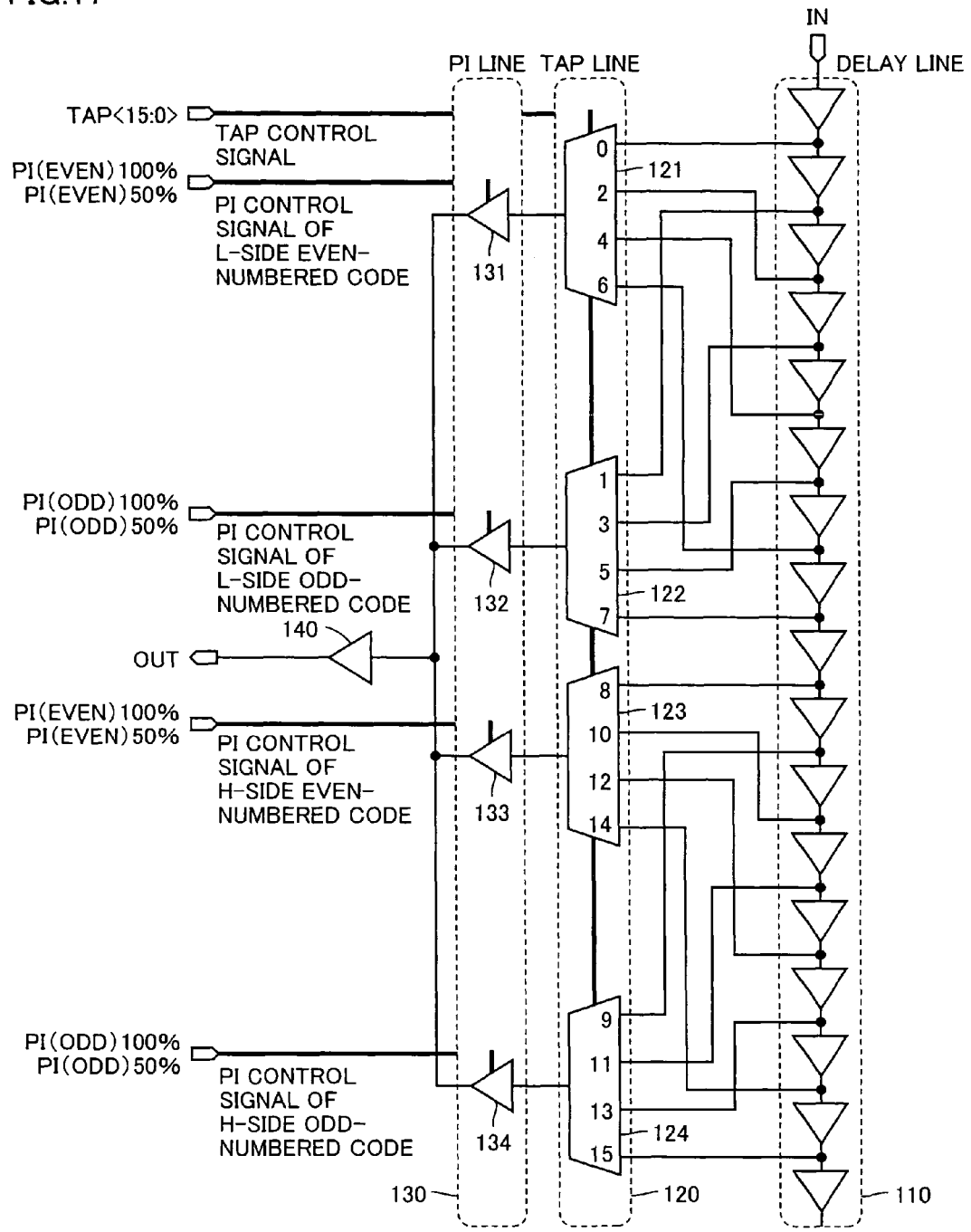
FIG. 17 is a block diagram showing an internal configuration of VDL in a seventh embodiment of the present invention.

FIG. 17 is a block diagram showing an internal configuration of VDL in a seventh embodiment of the present invention. This VDL includes a Delay Line 110, a TAP Line 120, a PI Line 130, and a buffer 140.

Delay Line 110 has a configuration including (2N+1) Delay Units connected in series. In FIG. 17, N=8 and 4N corresponds to the number of codes.

Tap Line 120 is formed of four selectors 121-124 for selecting an output from Delay Line 110. The numeral of an input of each selector indicates the output of which Delay Unit is connected thereto. The output of Delay Unit with an even number up to N is connected to selector 121. The output of Delay Unit with an odd number up to N is connected to selector 122. The output of Delay Unit with an even number from N+1 to 2N is connected to selector 123. The output of Delay Unit with an odd number from N+1 to 2N is connected to selector 124. The selection by selectors 121-124 is performed by control signal VDL_TAP (TAP<0:15>).

PI Line 130 is formed of phase interpolators PI 131-134. When a control code is even-numbered, only one phase interpolator PI is rendered conductive (referred to as 100% hereinafter). When a control code is odd-numbered, either two phase interpolators PI 131 and 132 or 133 and 134 are rendered conductive. Thus, an intermediate phase between the respective inputs is output (referred to as 50% hereinafter). The ratio of interpolation of phase interpolator PI is determined by control signal VDL_PI (PI 100%/50%).

Figure 18:
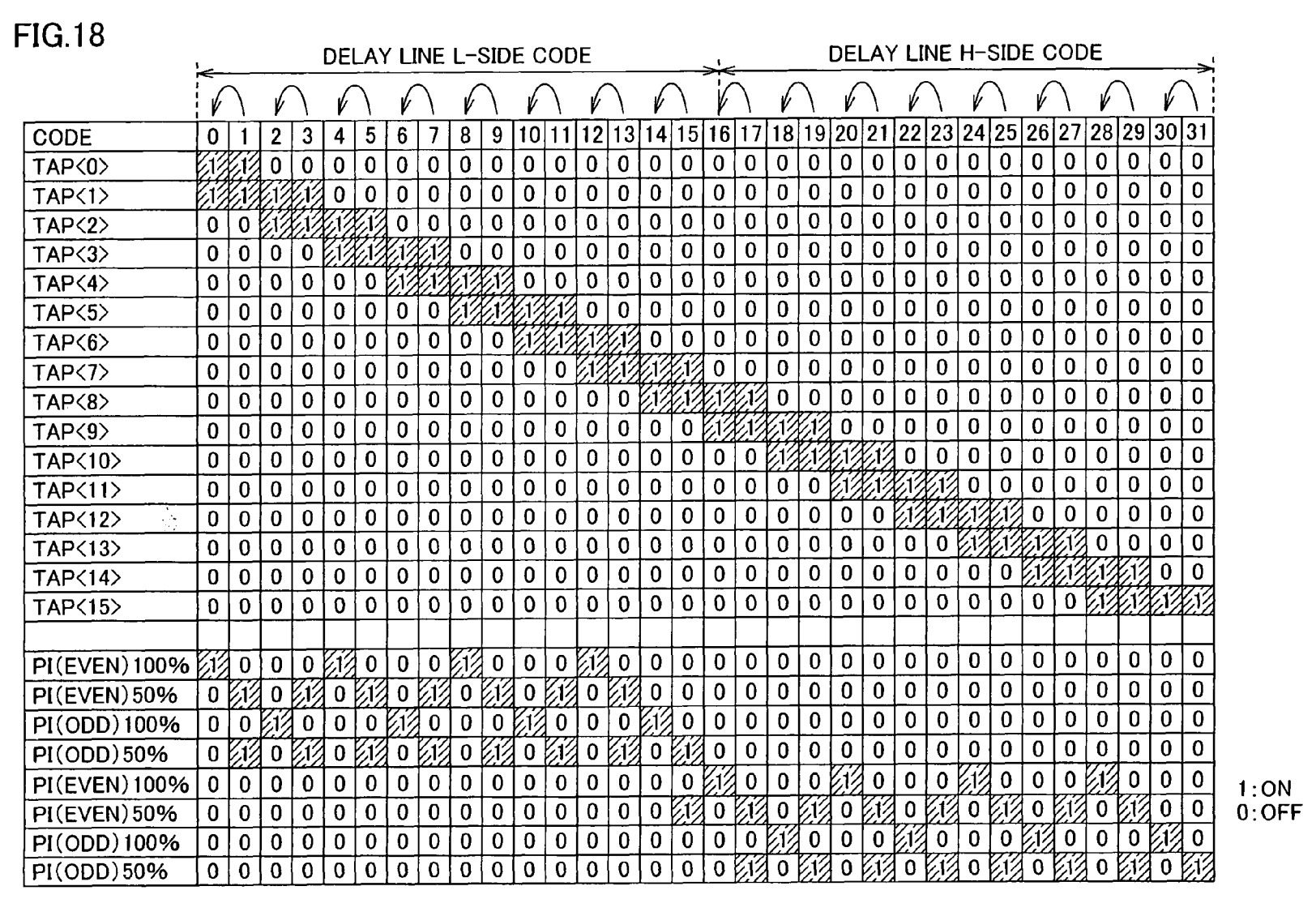

FIG. 18 shows the relation between the numeric values of control codes and control signals TAP<0:15> and PI 100%/50%. The left half in FIG. 18 (control codes 0-15) shows the L-side codes (control codes that select the upper half) of Delay Line 110 shown in FIG. 17. On the other hand, the right half in FIG. 18 (control codes 16 to 31) shows the H-side coded (control codes that select the lower half) of Delay Line 110 shown in FIG. 17.

As shown in FIG. 17, in the N-th position of Delay Line, the same number of Delay Units, selectors and interpolators PI each are connected, so that the load capacitance on the propagation path from each Delay Unit to the output OUT of VDL can easily be made uniform, thereby readily achieving the same delay variation amount with respect to the control code of VDL.

Figure 19:
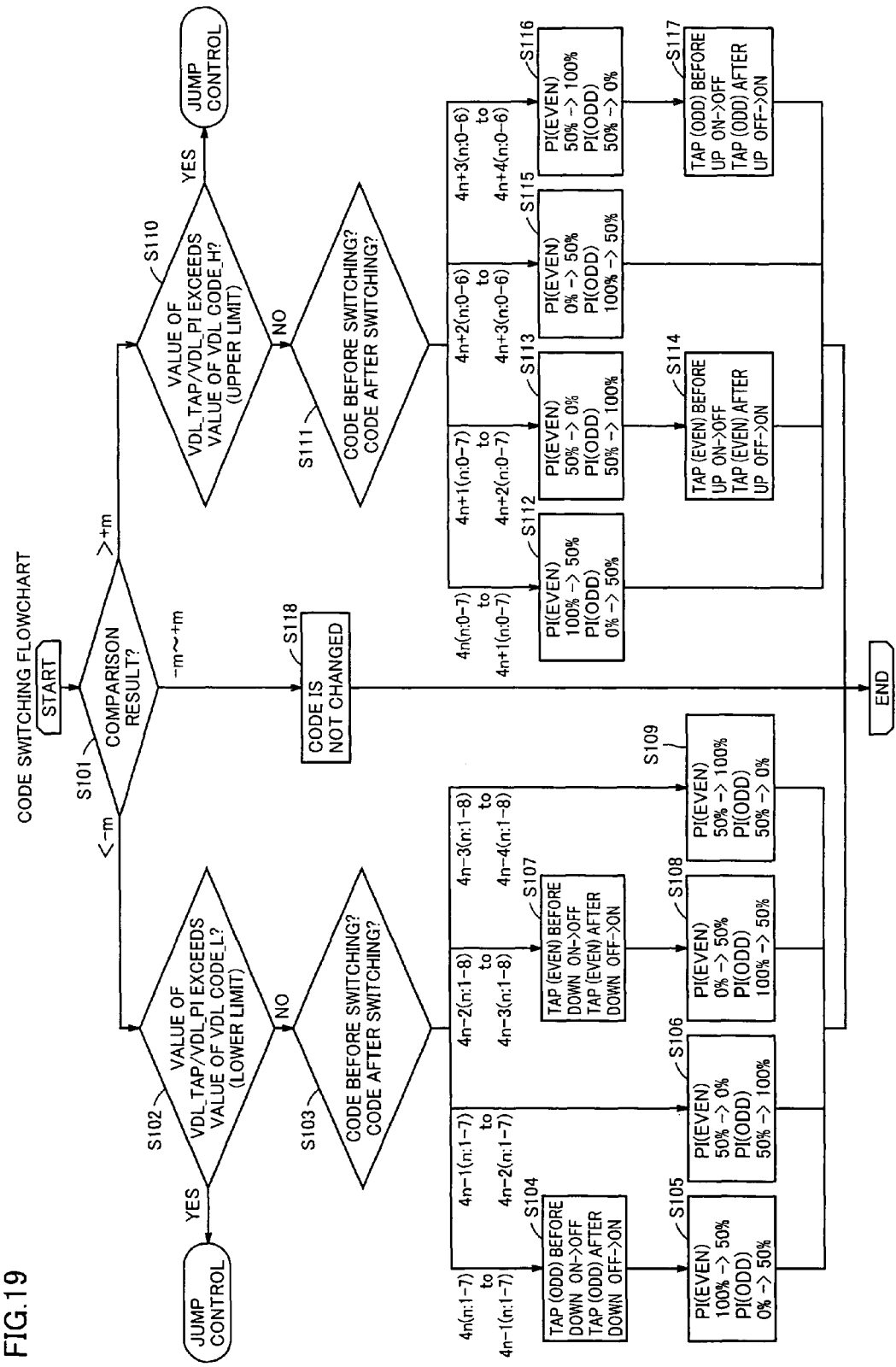
FIG. 19 is a flowchart illustrating a process procedure of code switching in the CDR circuit in the seventh embodiment of the present invention.

FIG. 19 is a flowchart illustrating a process procedure of code switching in CDR circuit in the seventh embodiment of the present invention. First, N-time Counter 21 counts the phase comparison results from PD 14 N times. If the count value is smaller than −m (S 101, <−m), MIN/MAX Detector 29 determines whether or not the value of VDL_TAP/VDL_PI calculated by ADDER 23 exceeds the value of VDL CODE_L (S102). If the value of VDL CODE_L is exceeded (S 102, Yes), ADDER 23 performs CODE JUMP described above.

On the other hand, if the value of VDL CODE_L is not exceeded (S102, No), the code before switching and the code after switching are determined (S103). If the code before switching is 4n (n=1-7) and the code after switching is 4n−1 (n=1-7), TAP (odd) before down is switched from ON to OFF, and TAP (odd) after down is switched from OFF to ON (S104). Then, the output current value of PI (even) is switched from 100% to 50% and the output current value of PI (odd) is switched from 0% to 50% (S105). The process then ends.

If the code before switching is 4n−1 (n=1-7) and the code after switching is 4n−2 (n=1-7), the output current value of PI (even) is switched from 50% to 0% and the output current value of PI (odd) is switched from 50% to 100% (S106). The process then ends.

If the code before switching is 4n−2 (n=1-8) and the code after switching is 4n−3 (n=1-8), TAP (even) before down is switched from ON to OFF and TAP (even) after down is switched from OFF to ON (S107). Then, the output current value of PI (even) is switched from 0% to 50% and the output current value of PI (odd) is switched from 100% to 50% (S108). The process then ends.

If the code before switching is 4n−3 (n=1-8) and the code after switching is 4n−4 (n=1-8), the output current value of PI (even) is switched from 50% to 100% and the output current value of PI (odd) is switched from 50% to 0% (S109). The process then ends.

If the count value is larger than +m (S101, >+m), MIN/MAX Detector 29 determines whether or not the value of VDL_TAP/VDL_PI calculated by ADDER 23 exceeds the value of VDL_CODE_H (S110). If the value of VDL_CODE_H is exceeded (S110, Yes), ADDER 23 performs CODE JUMP described above.

On the other hand, if the value of VDL_CODE_H is not exceeded (S110, No), the code before switching and the code after switching are determined (S111). If the code before switching is 4n (n=0-7) and the code after switching is 4n+1 (n=0-7), the output current value of PI (even) is switched from 100% to 50% and the output current value of PI (odd) is switched from 0% to 50% (S112). The process then ends.

If the code before switching is 4n+1 (n=0-7) and the code after switching is 4n+2 (n=0-7), the output current value of PI (even) is switched from 50% to 0% and the output current value of PI (odd) is switched from 50% to 100% (S113). Then, TAP (even) before up is switched from ON to OFF and TAP (even) after up is switched from OFF to ON (S114). The process then ends.

If the code before switching is 4n+2 (n=0-6) and the code after switching is 4n+3 (n=0-6), the output current value of PI (even) is switched from 0% to 50% and the output current value of PI (odd) is switched from 100% to 50% (S115). The process then ends.

If the code before switching is 4n+3 (n=0-6) and the code after switching is 4n+4 (n=0-6), the output current value of PI (even) is switched from 50% to 100% and the output current value of PI (odd) is switched from 50% to 0% (S116). Then, TAP (odd) before up is switched from ON to OFF and TAP (odd) after up is switched from OFF to ON (S117). The process then ends.

Figure 20:
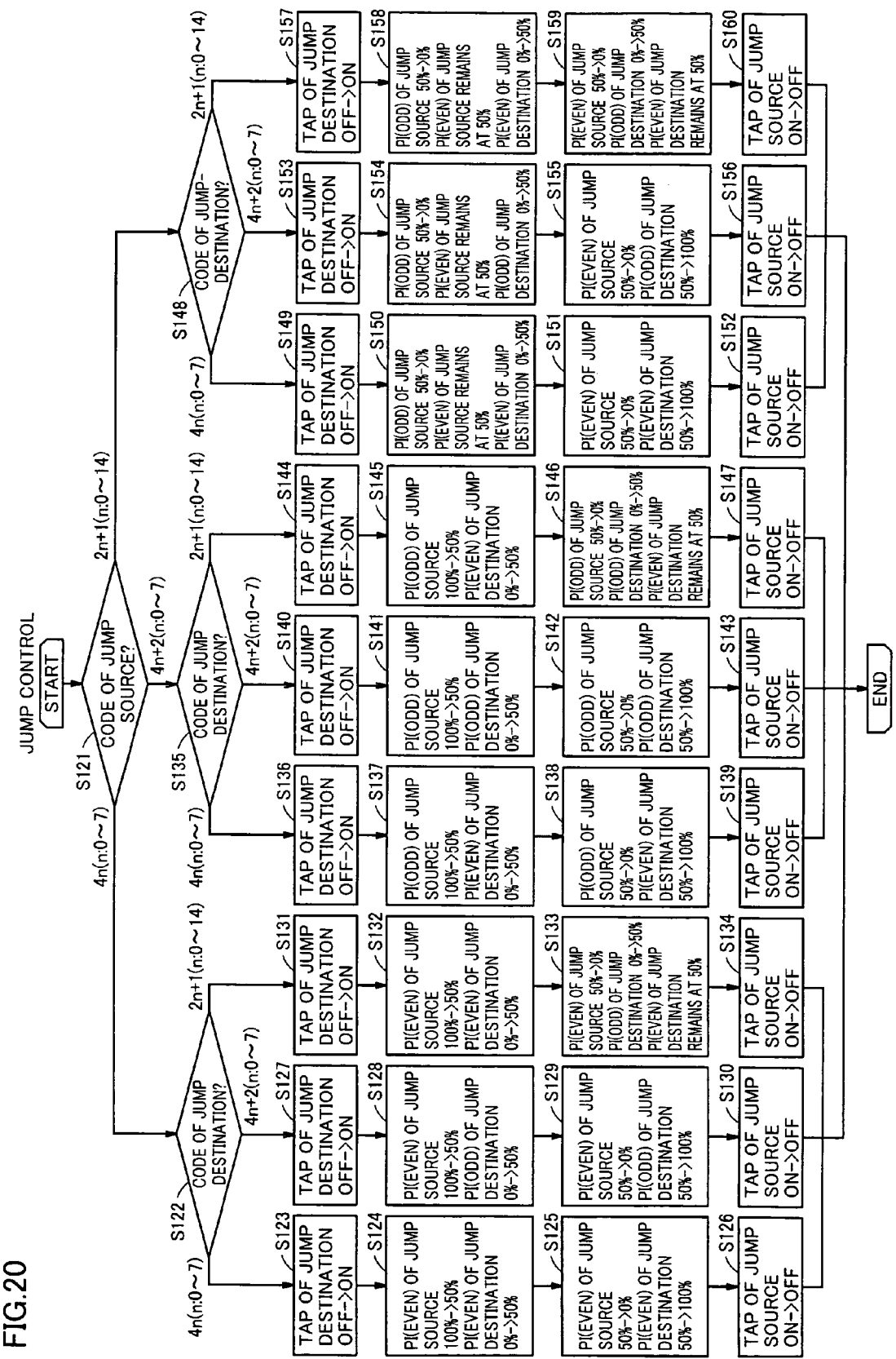
FIG. 20 is a flowchart illustrating a process procedure of CODE JUMP in the CDR circuit in the seventh embodiment.

FIG. 20 is a flowchart illustrating a process procedure of CODE JUMP of the CDR circuit in the seventh embodiment of the present invention. First, ADDER 23 determines whether a code of Jump source is a multiple of four, an even number that is not a multiple of four, or an odd number (S121). If the code of Jump source is 4n (n=0-7), it is determined whether a code of Jump destination is a multiple of four, an even number that is not a multiple of four, or an odd number (S122).

If the code of Jump destination is 4n (n=0-7), TAP of Jump destination is switched from OFF to ON (S123), the output current value of PI (even) of Jump source is switched from 100% to 50%, the output current value of PI (even) of Jump destination is switched from 0% to 50% (S124), the output current value of PI (even) of Jump source is switched from 50% to 0%, the output current value of PI (even) of Jump destination is switched from 50% to 100% (S125), and TAP of Jump source is switched from ON to OFF (S126). The process then ends.

If the code of Jump destination is 4n+2 (n=0-7), TAP of Jump destination is switched from OFF to ON (S127), the output current value of PI (even) of Jump source is switched from 100% to 50%, the output current value of PI (odd) of Jump destination is switched from 0% to 50% (S128), the output current value of PI (even) of Jump source is switched from 50% to 0%, the output current value of PI (odd) of Jump destination is switched from 50% to 100% (S129), and TAP of Jump source is switched from ON to OFF (S130). The process then ends.

If the code of Jump destination is 2n+1 (n=0-14), TAP of Jump destination is switched from OFF to ON (S131), the output current value of PI (even) of Jump source is switched from 100% to 50%, the output current value of PI (even) of Jump destination is switched from 0% to 50% (S132), the output current value of PI (even) of Jump source is switched from 50% to 0%, the output current value of PI (odd) of Jump destination is switched from 0% to 50%, the output current value of PI (even) of Jump destination is kept at 50% (S133), and TAP of Jump source is switched from ON to OFF (S134). The process then ends.

If code of Jump source is 4n+2 (n=0-7) at step S121, it is determined whether code of Jump destination is a multiple of four, an even number that is not a multiple of four, or an odd number (S135).

If the code of Jump destination is 4n (n=0-7), TAP of Jump destination is switched from OFF to ON (S136), the output current value of PI (odd) of Jump source is switched from 100% to 50%, the output current value of PI (even) of Jump destination is switched from 0% to 50% (S137), the output current value of PI (odd) of Jump source is switched from 50% to 0%, the output current value of PI (even) of Jump destination is switched from 50% to 100% (S138), and TAP of Jump source is switched from ON to OFF (S139). The process then ends.

If the code of Jump destination is 4n+2 (n=0-7), TAP of Jump destination is switched from OFF to ON (S140), the output current value of PI (odd) of Jump source is switched from 100% to 50%, the output current value of PI (odd) of Jump destination is switched from 0% to 50% (S141), the output current value of PI (odd) of Jump source is switched from 50% to 0%, the output current value of PI (odd) of Jump destination is switched from 50% to 100% (S142), and TAP of Jump source is switched from ON to OFF (S143). The process then ends.

If the code of Jump destination is 2n+1 (n=0-14), TAP of Jump destination is switched from OFF to ON (S144), the output current value of PI (odd) of Jump source is switched from 100% to 50%, the output current value of PI (even) of Jump destination is switched from 0% to 50% (S145), the output current value of PI (odd) of Jump source is switched from 50% to 0%, the output current value of PI (odd) of Jump destination is switched from 0% to 50%, the output current value of PI (even) of Jump destination is kept at 50% (S146), and TAP of Jump source is switched from ON to OFF (S147). The process then ends.

If code of Jump source is 2n+1 (n=0-14) at step S121, it is determined whether code of Jump destination is a multiple of four, an even number that is not a multiple of four, or an odd number (S148).

If the code of Jump destination is 4n (n=0-7), TAP of Jump destination is switched from OFF to ON (S149), the output current value of PI (odd) of Jump source is switched from 50% to 0%, the output current value of PI (even) of Jump source is kept at 50%, the output current value of PI (even) of Jump destination is switched from 0% to 50% (S150), the output current value of PI (even) of Jump source is switched from 50% to 0%, and the output current value of PI (even) of Jump destination is switched from 50% to 100% (S151), and TAP of Jump source is switched from ON to OFF (S152). The process then ends.

If the code of Jump destination is 4n+2 (n=0-7), TAP of Jump destination is switched from OFF to ON (S153), the output current value of PI (odd) of Jump source is switched from 50% to 0%, the output current value of PI (even) of Jump source is kept at 50%, the output current value of PI (odd) of Jump destination is switched from 0% to 50% (S154), the output current value of PI (even) of Jump source is switched from 50% to 0%, and the output current value of PI (odd) of Jump destination is switched from 50% to 100% (S155), and TAP of Jump source is switched from ON to OFF (S156). The process then ends.

If the code of Jump destination is 2n+1 (n=0-14), TAP of Jump destination is switched from OFF to ON (S157), the output current value of PI (odd) of Jump source is switched from 50% to 0%, the output current value of PI (even) of Jump source is kept at 50%, the output current value of PI (even) of Jump destination is switched from 0% to 50% (S 158), the output current value of PI (even) of Jump source is switched from 50% to 0%, the output current value of PI (odd) of Jump destination is switched from 0% to 50%, the output current value of PI (even) of Jump destination is kept at 50% (S159), and TAP of Jump source is switched from ON to OFF (S160). The process then ends.

As described above, according to the CDR circuit in the present embodiment, PI is used in CODE JUMP to obtain an intermediate phase before achieving a desired phase, thereby preventing an output of a pulse signal having a narrow width, such as glitch noise or hazard.

In addition, in the N-th position of Delay Line, the same number of Delay Units, selectors and interpolators PI each are connected, so that the load capacitance on the propagation path from each Delay Unit to the output OUT of VDL can easily be made uniform, thereby readily achieving the same delay variation amount with respect to the control code of VDL.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock data recovery circuit generating an output clock synchronized with a data signal, comprising:
   a first detection portion detecting a phase difference between said data signal and said output clock;
   a variable delay portion varying a delay of a clock in accordance with a control code; and
   a code changing portion changing a value of said control code,
   said code changing portion including:
      a second detection portion detecting a value of a control code corresponding to a delay equal to one period of said output clock,
      a storage portion storing the value of the control code detected by said second detection portion, and
      an operation portion adding or subtracting at a time the value stored in said storage portion to/from the control code when a delay amount of said variable delay portion exceeds one period of the clock in synchronizing said output clock with said data signal while changing said control code in accordance with a detection result by said first detection portion.

2. The clock data recovery circuit according to claim 1, wherein
   said storage portion includes:
      an upper limit value storing portion storing an upper limit value of said control code, and
      a lower limit value storing portion storing a lower limit value of said control code,
   said operation portion includes
      an increment portion generating a code for performing addition/subtraction of the control code in accordance with a detection result by said first detection portion,
      a code operating portion performing addition/subtraction of the control code in accordance with the code generated by said increment portion, and
      a determination portion determining whether or not the delay amount of said variable delay portion exceeds one period of the clock by determining whether or not the control code computed by said code operating portion attains the upper limit value stored in said upper limit value storing portion or the lower limit value stored in said lower limit value storing portion, and
   said code operating portion adds or subtracts at a time the value calculated from the upper limit value stored in said upper limit value storing portion and the lower limit value stored in said lower limit value storing portion, when said determination portion determines that one period of the clock is exceeded.

3. The clock data recovery circuit according to claim 2, wherein said increment portion reduces the delay amount of said variable delay portion in order from a first initial value, when the control code does not reach a delay amount equal to one period of said output clock even when reaching a minimum value, stores the minimum value in said lower limit value storing portion, and increases the delay amount in order from a second initial value to store the control code at a time of being equal to the delay amount of said output clock, into said upper limit value storing portion.

4. The clock data recovery circuit according to claim 2, wherein, in determining whether or not the delay amount of said variable delay portion exceeds one period of the clock, said determination portion adds a prescribed value to the upper limit value stored in said upper limit value storing portion for determination.

5. The clock data recovery circuit according to claim 2, wherein, in determining whether or not the delay amount of said variable delay portion exceeds one period of the clock, said determination portion subtracts a prescribed value from the lower limit value stored in said lower limit value storing portion for determination.

6. The clock data recovery circuit according to claim 2, wherein
   said operation portion further includes:
      an addition portion adding a prescribed value to the upper limit value stored in said upper limit value storing portion for output to said determination portion, and
      a subtraction portion subtracting the prescribed value from the lower limit value stored in said lower limit value storing portion for output to said determination portion,
   said determination portion determines whether or not one period of the clock is exceeded based on a value output from said addition portion and a value output from said subtraction portion, and said code operating portion adds or subtracts a value calculated from the value output from said addition portion, the value output from said subtraction portion, and said prescribed value to/from the control code at a time, when said determination portion determines that one period of the clock is exceeded.

7. The clock data recovery circuit according to claim 1, wherein said clock data recovery circuit has two said variable delay portions, said second detection portion detects the control code corresponding to a delay equal to one period of said output clock by controlling a first variable delay portion, and in synchronizing said output clock with said data signal while changing a control code of a second variable delay portion in accordance with a detection result by said first detection portion, said operation portion adds or subtracts at a time the value stored in said storage portion to/from the control code when a delay amount of said second variable delay portion exceeds one period of the clock.

8. The clock data recovery circuit according to claim 1, wherein said clock data recovery circuit has two said variable delay portions, said clock data recovery circuit comprising:
- a first storage portion storing a control code corresponding to a delay equal to one period of an output clock of a first variable delay portion detected by said second detection portion,
- a second storage portion storing a control code corresponding to a delay equal to one period of an output clock of a second variable delay portion detected by said second detection portion,
- a comparison portion making a comparison between a value stored in said first storage portion and a value stored in said second storage portion, and
- an operation determination portion determining whether or not said clock data recovery circuit is to be operated in accordance with a comparison result by said comparison portion.

9. The clock data recovery circuit according to claim 1, wherein said clock data recovery circuit has two said variable delay portions, said second detection portion detects a control code corresponding to a delay equal to one period of said output clock by controlling a first variable delay portion, and in synchronizing said output clock with said data signal while changing the control code of said first variable delay portion in accordance with a detection result by said first detection portion, when a delay amount of said first variable delay portion exceeds one period of the clock, said operation portion adds or subtracts the value stored in said storage portion to/from the control code of a second variable delay portion at a time, then switches an operation to said second variable delay portion, and thereafter adds or subtracts the value stored in said storage portion to/from the control code of said first variable delay portion at a time for synchronization between said output clock and said data signal, and in synchronizing said output clock with said data signal while changing the control code of said second variable delay portion in accordance with a detection result by said first detection portion, when a delay amount of said second variable delay portion exceeds one period of the clock, said operation portion adds or subtracts the value stored in said storage portion to/from the control code of said first variable delay portion at a time, then switches an operation to said first variable delay portion, and thereafter adds or subtracts the value stored in said storage portion to/from the control code of said second variable delay portion at a time for synchronization between said output clock and said data signal.

10. The clock data recovery circuit according to claim 1, wherein said variable delay portion includes:
- a plurality of delay circuits,
- a plurality of selectors receiving outputs of said plurality of delay circuits, and
- a phase interpolation circuit interpolating phases of the clock by controlling outputs of said plurality of selectors, and
- a same number of delay circuits and a same number of phase interpolation circuits are connected to each of said plurality of selectors.

11. The clock data recovery circuit according to claim 1, wherein said variable delay portion includes:
- a plurality of delay circuits,
- a plurality of selectors receiving outputs of said plurality of delay circuits, and
- a phase interpolation circuit interpolating phases of the clock by controlling outputs of said plurality of selectors, and
- when said operation portion adds or subtracts the value stored in said storage portion to/from the control code at a time, a value of the control code is changed by switching paths of the selectors and the phase interpolation circuit multiple times.

\* \* \* \* \*